United States Patent [19]

Terasawa et al.

[11] Patent Number: 6,075,269

[45] Date of Patent: Jun. 13, 2000

[54] SEMICONDUCTOR DEVICE AND PROCESS FOR MANUFACTURING THE SAME

[75] Inventors: Yoshio Terasawa, Hitachinaka; Takayuki Sekiya, Nagoya, both of Japan

[73] Assignee: NGK Insulators, Ltd., Japan

[21] Appl. No.: 09/068,718

[22] PCT Filed: Sep. 19, 1997

[86] PCT No.: PCT/JP97/03324

§ 371 Date: Jul. 2, 1998

§ 102(e) Date: Jul. 2, 1998

[87] PCT Pub. No.: WO98/12756

PCT Pub. Date: Mar. 26, 1998

[30] Foreign Application Priority Data

Sep. 19, 1996 [JP] Japan ................................. 8-247544

[51] Int. Cl.[7] .......................... H01L 29/744; H01L 29/78
[52] U.S. Cl. .......................... 257/330; 257/334; 257/153; 438/700; 438/734
[58] Field of Search .................................. 257/330, 331, 257/332, 334, 144, 153, 163; 438/700, 734, 735

[56] References Cited

U.S. PATENT DOCUMENTS

| 4,403,396 | 9/1983 | Stein ......................................... 29/571 |
| 4,774,555 | 9/1988 | Kohn et al. ................................ 357/22 |

FOREIGN PATENT DOCUMENTS

| 0540262 | 5/1993 | European Pat. Off. . |
| 0726602 | 8/1996 | European Pat. Off. . |
| 2557727 | 7/1985 | France . |
| 36 15 519 A1 | 11/1987 | Germany ............................... 257/332 |
| 3809218 | 9/1988 | Germany . |
| 39 27 163 A1 | 2/1991 | Germany ............................... 257/332 |
| 5-7002 | 1/1993 | Japan .................................... 257/332 |
| 5-110105 | 4/1993 | Japan .................................... 257/332 |
| 5-226273 | 9/1993 | Japan .................................... 257/332 |

OTHER PUBLICATIONS

Patent Abstracts of Japan, vol. 017, No. 466 (E–1421) Aug. 25, 1993, JP 5–110105.

Patent Abstracts of Japan, vol. 010, No. 332 (E–453) Nov. 12, 1986, JP 61–137371.

Patent Abstracts of Japan, vol. 017, No. 672 (E–1474) Dec. 10, 1993, JP 5–226273.

Patent Abstracts of Japan, vol. 096, No. 001, Jan. 31, 1996, JP 7–235662.

Patent Abstracts of Japan, vol. 017, No. 264 (E–1370) May 24, 1993, JP 5–007002.

*Primary Examiner*—Donald L. Monin, Jr.
*Attorney, Agent, or Firm*—Parkhurst & Wendel, L.L.P.

[57] ABSTRACT

A semiconductor device that includes a recessed portion formed by isotropic-etching through an opening in an oxide layer on a surface of the semiconductor substrate, an opening formed in an oxide layer formed on the inner surface of the recessed portion by anisotropic etching, a recessed portion formed adjacent another recessed portion by isotropic etching through the opening. An overhang portion in the oxide layers at the opening is used as a mask in successive etching steps, and the isotropic and anistropic etching steps are repeated through the same mask, to eliminate errors in stacking masks and obtaining a deep notched gate structure within a short period. A cross-sectional shape of the recessed portion includes a plurality of curved recessed portions of different curvatures. A semiconductor device thus formed includes a recessed portion having a high aspect (length/width) ratio, and a depth larger than the width.

12 Claims, 25 Drawing Sheets

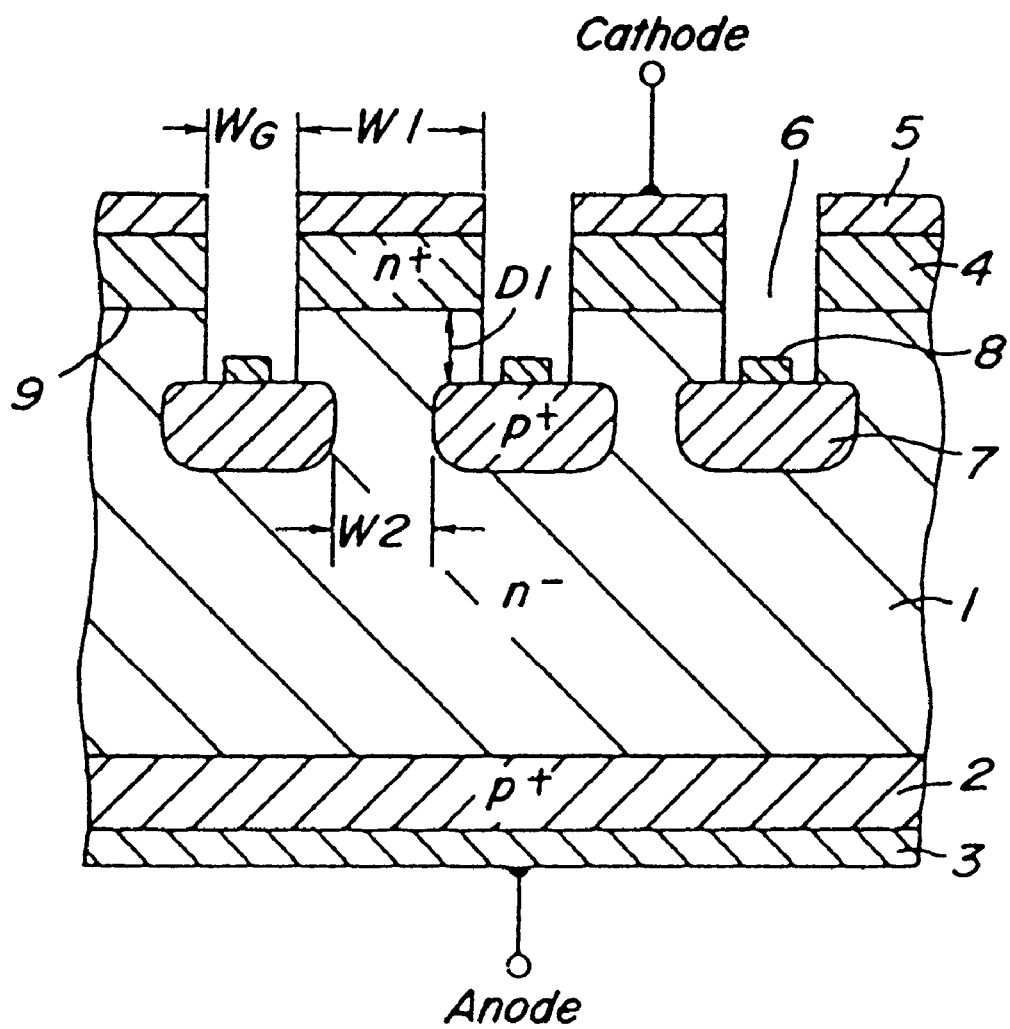
FIG_1

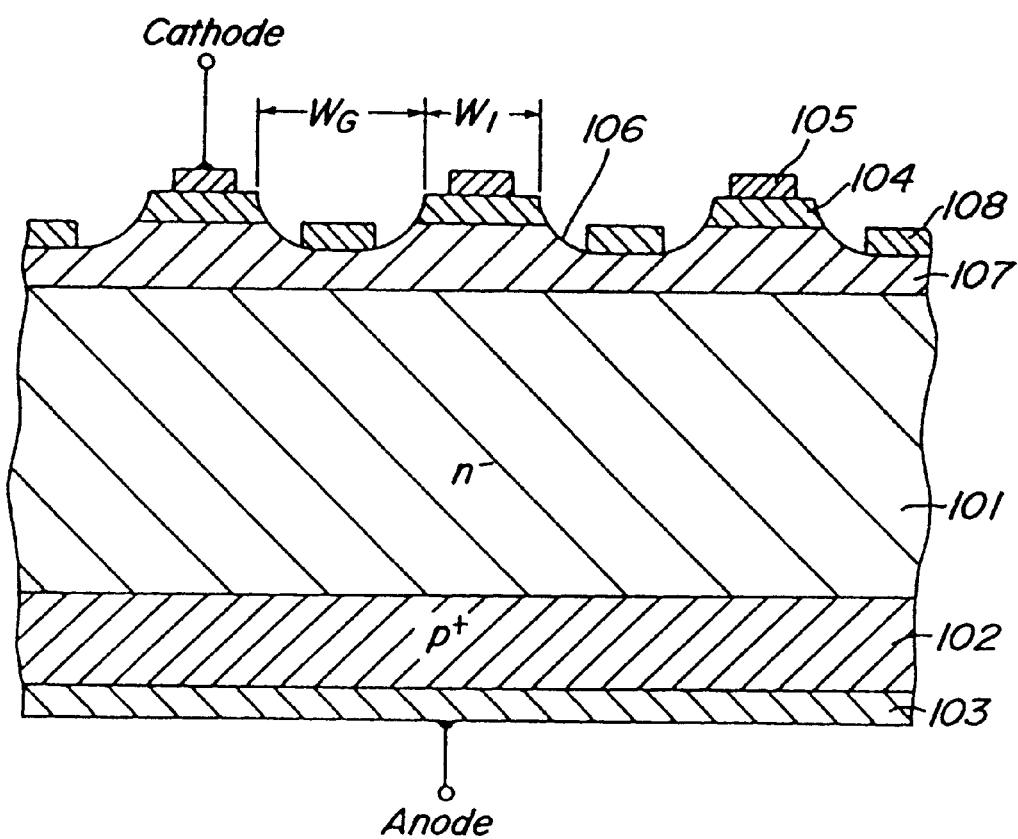
FIG_2

FIG._4
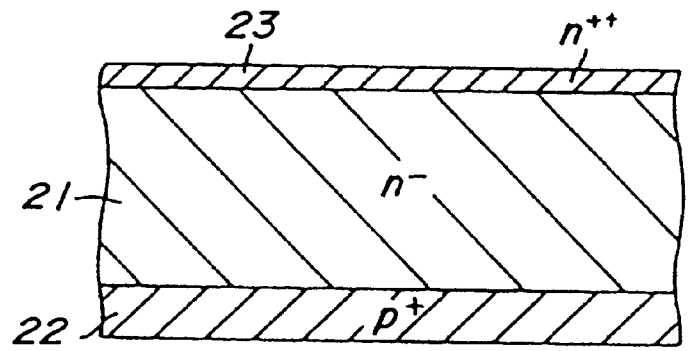
FIG._5
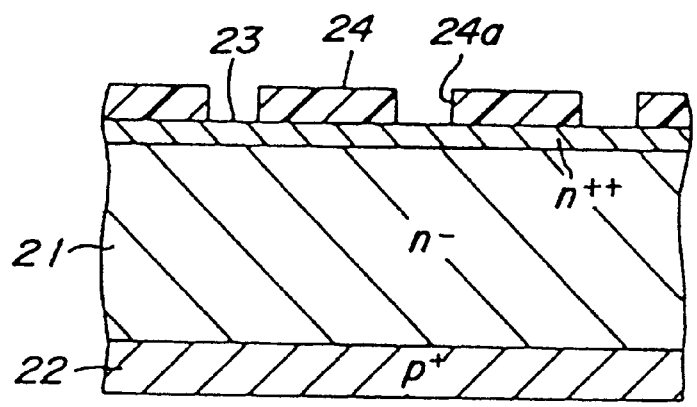
FIG._6
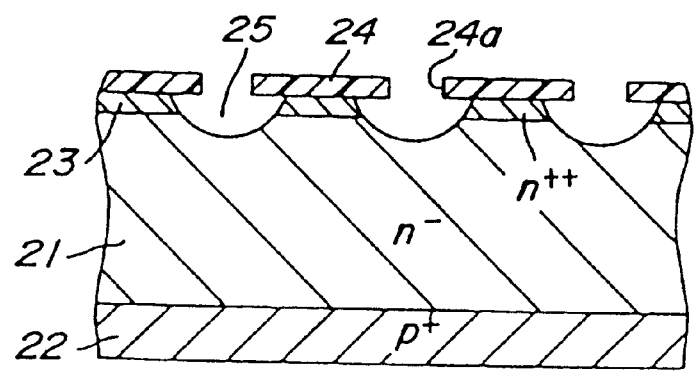

FIG_7
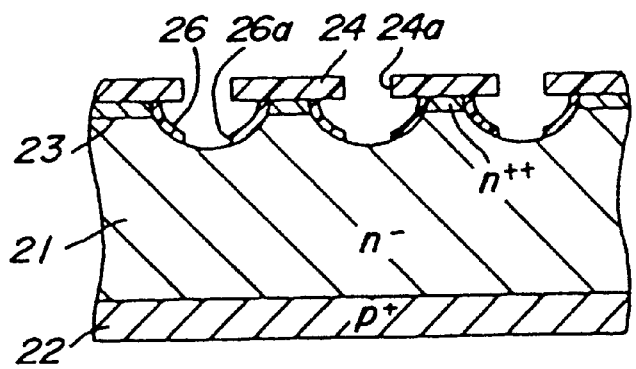
FIG_8
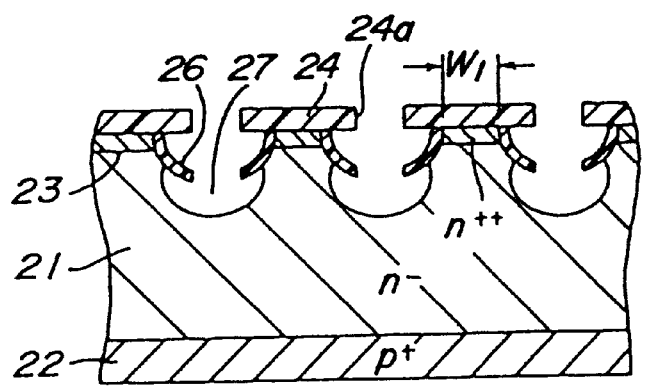
FIG_9
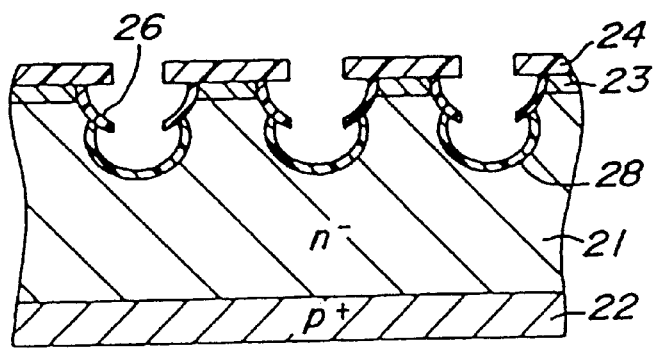

FIG_10
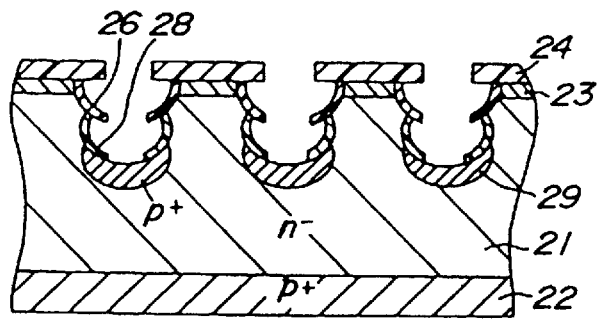
FIG_11
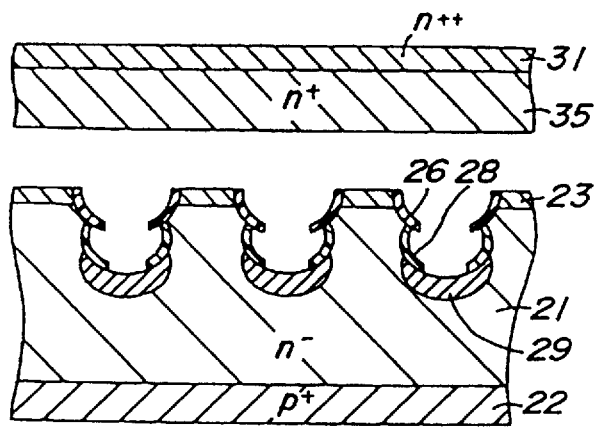
FIG_12
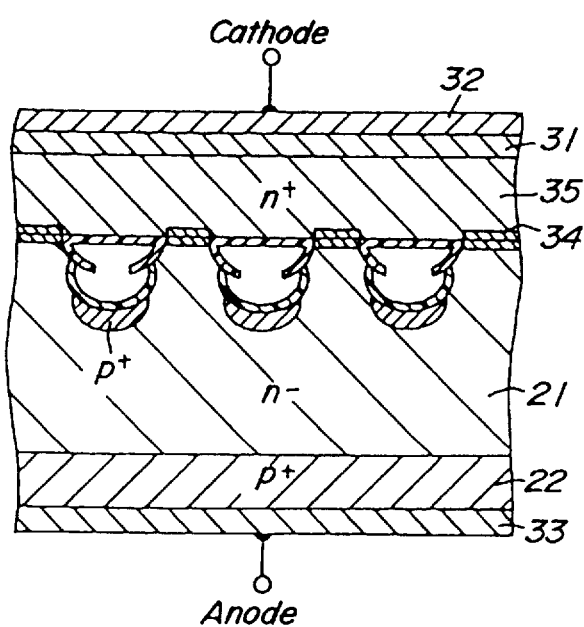

FIG_13
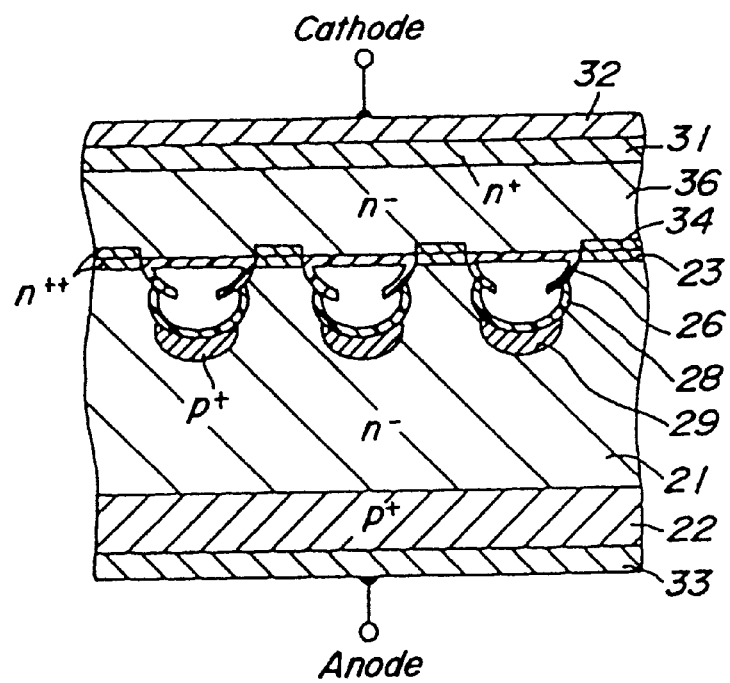
FIG_14
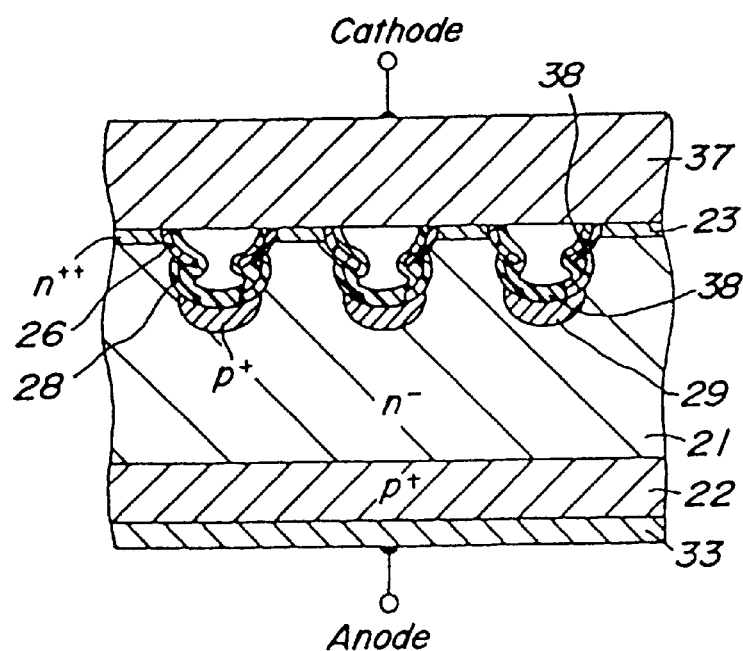

FIG_16
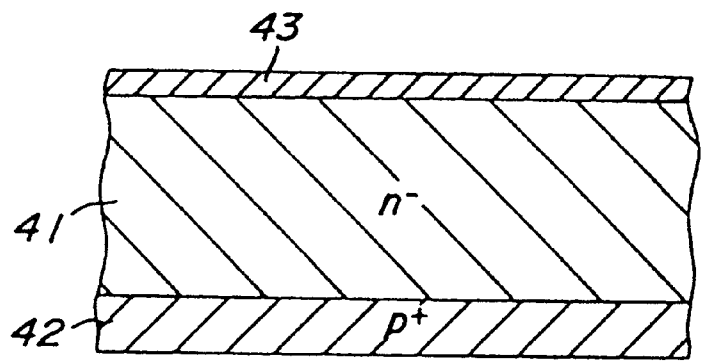
FIG_17
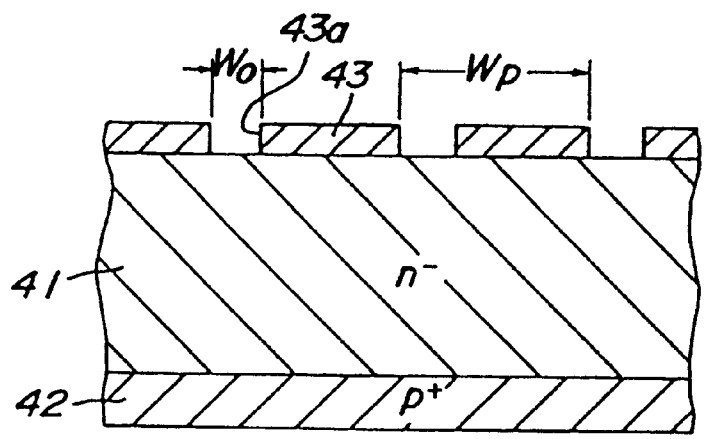
FIG_18
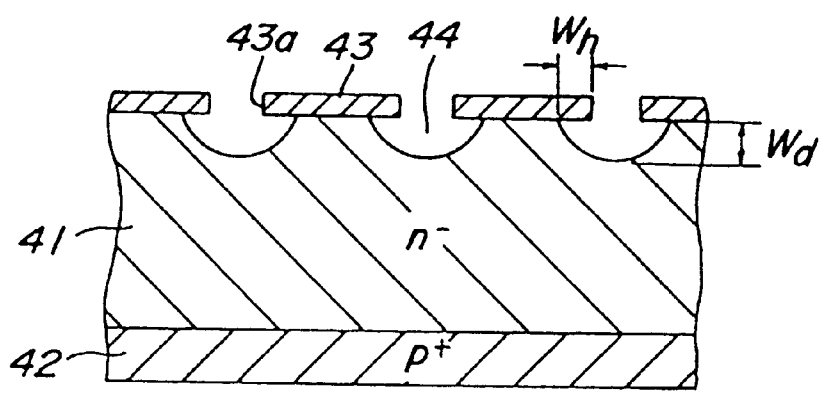

FIG_19
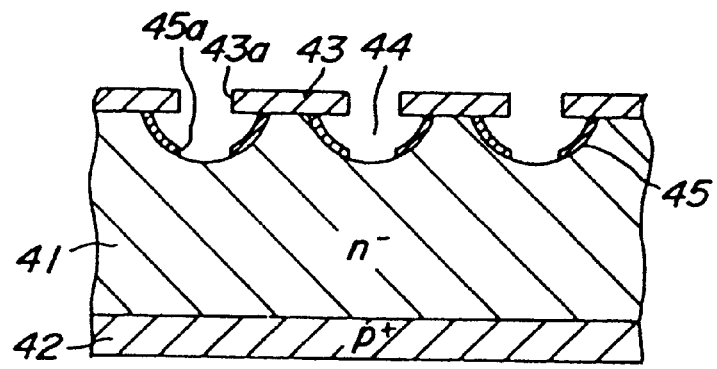
FIG_20
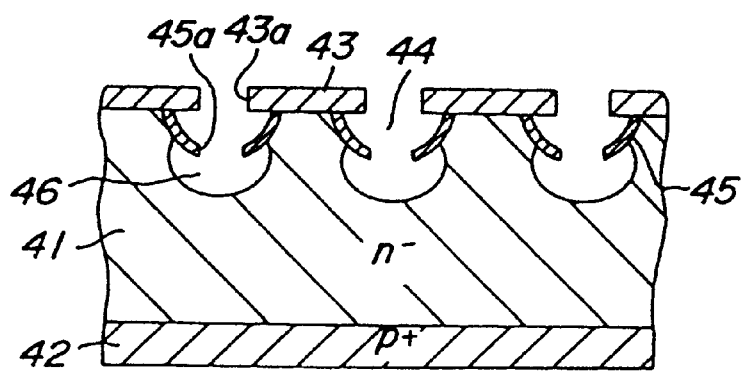
FIG_21
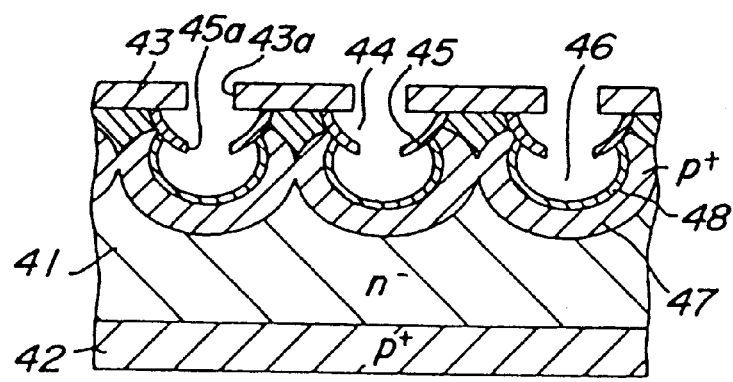

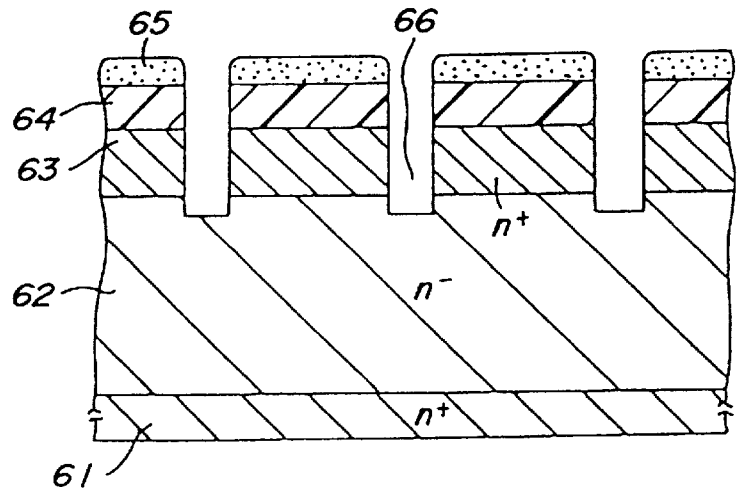
FIG._28
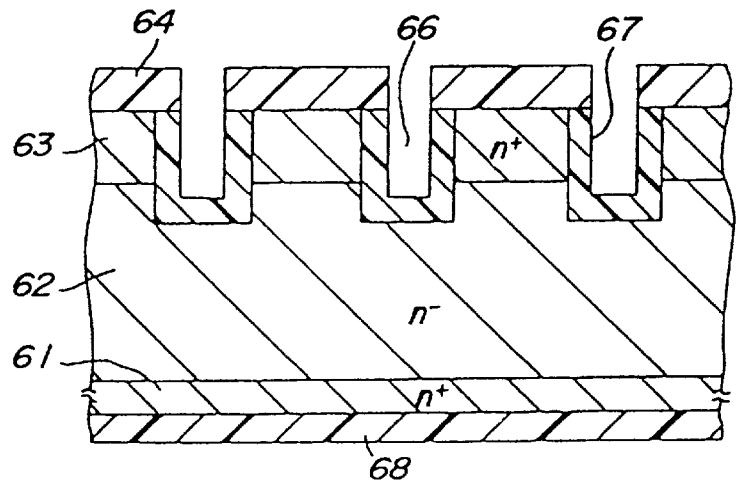
FIG._29
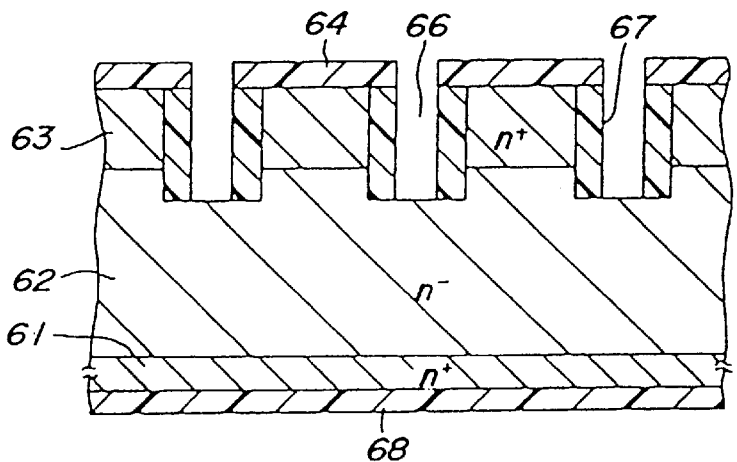
FIG._30

FIG_31
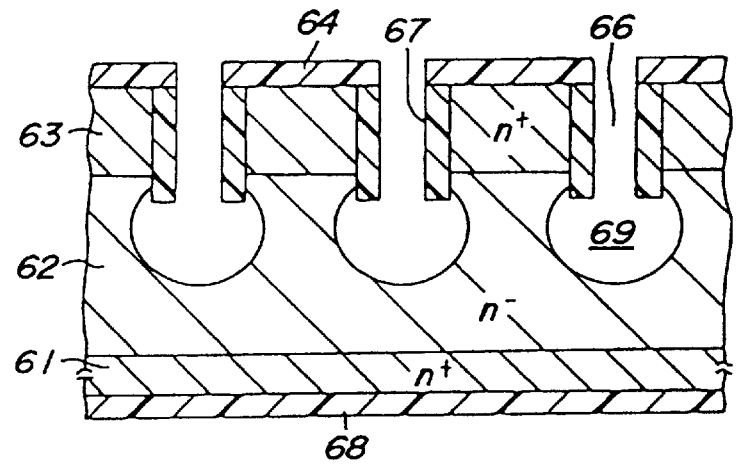
FIG_32
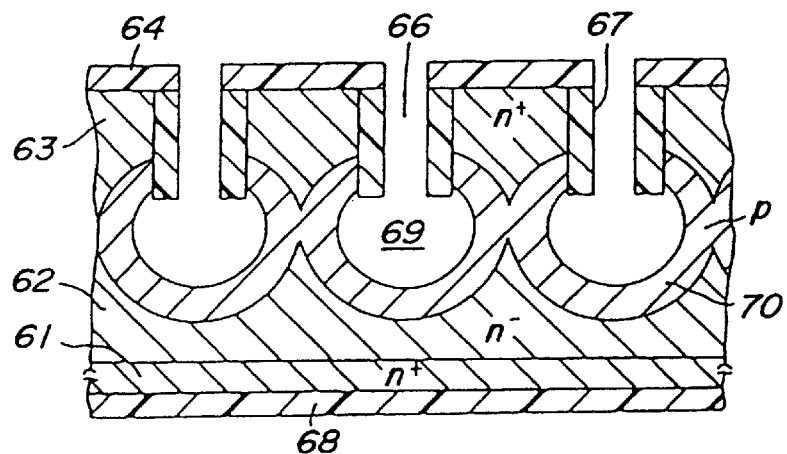
FIG_33
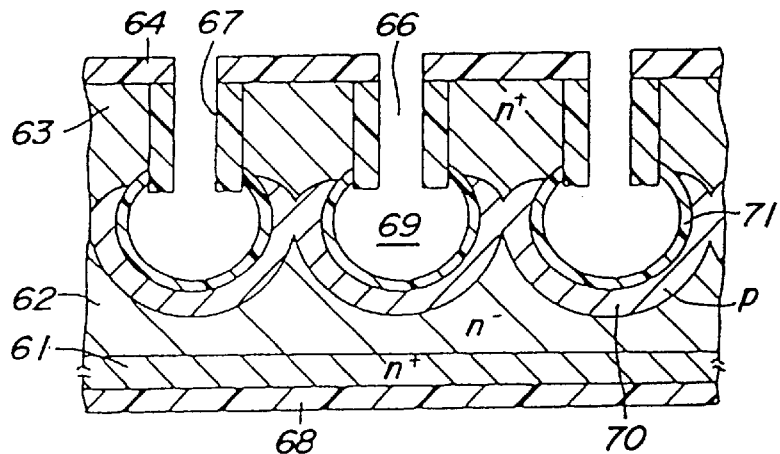

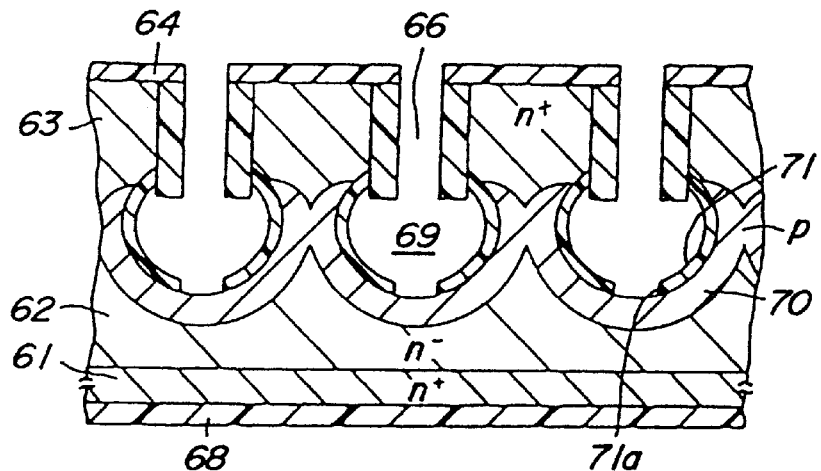
FIG_34
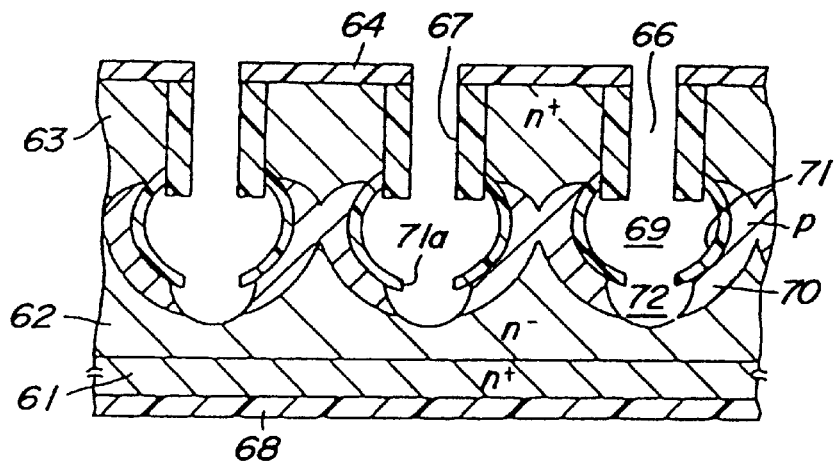
FIG_35
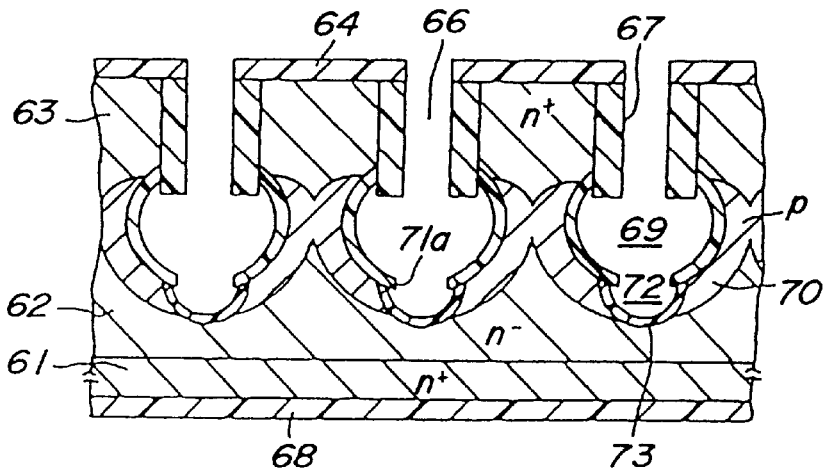
FIG_36

FIG._37
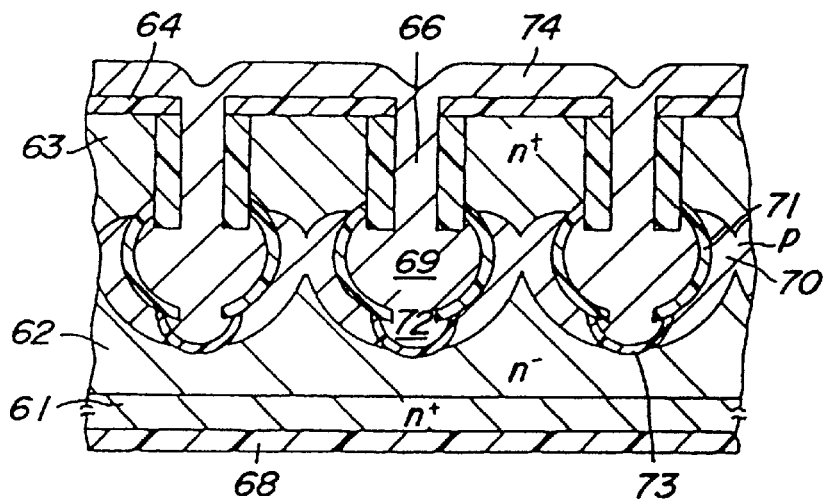
FIG._38
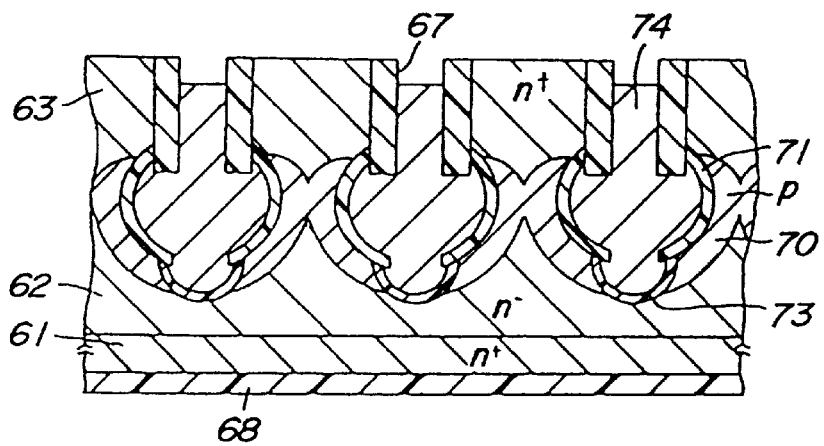
FIG._39
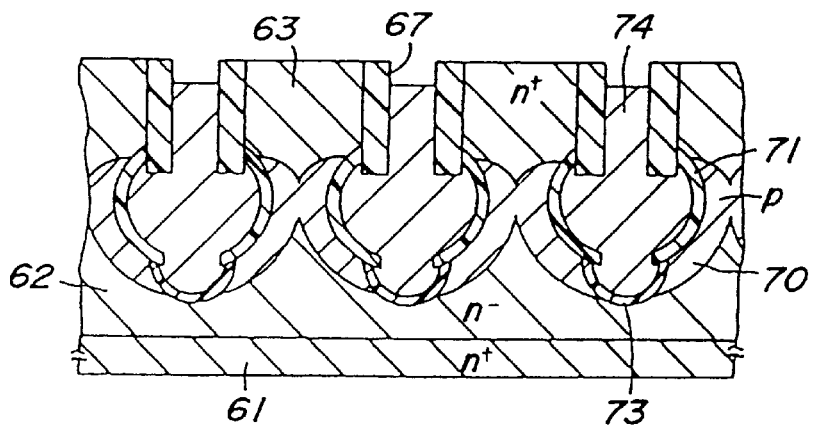

FIG_40
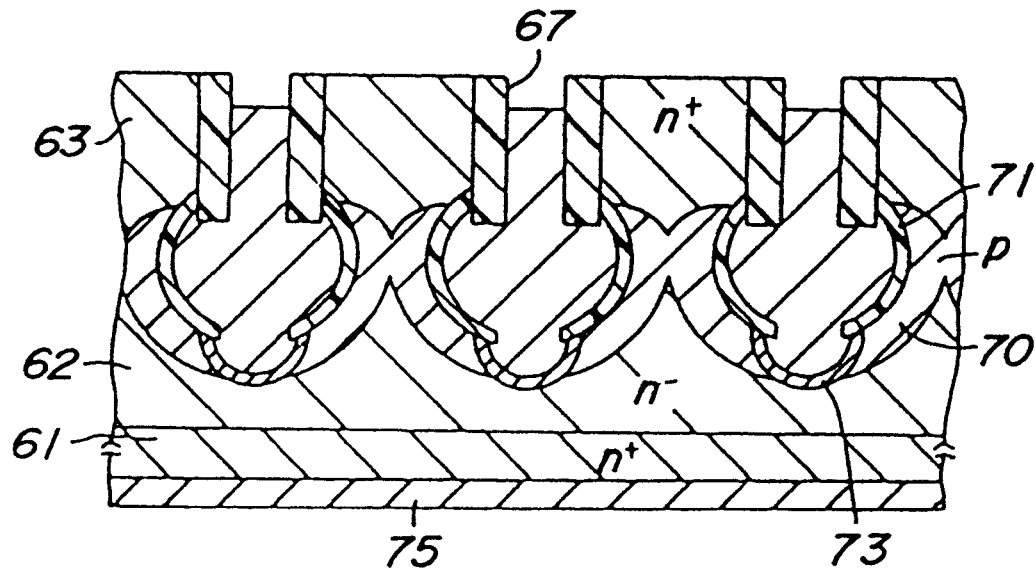
FIG_41
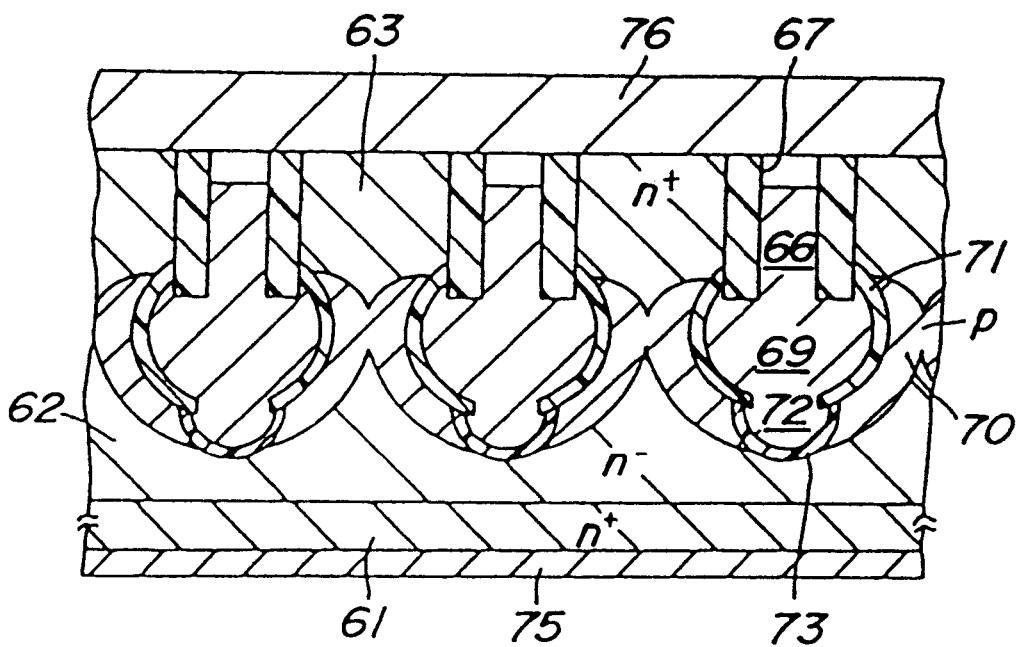

FIG._43
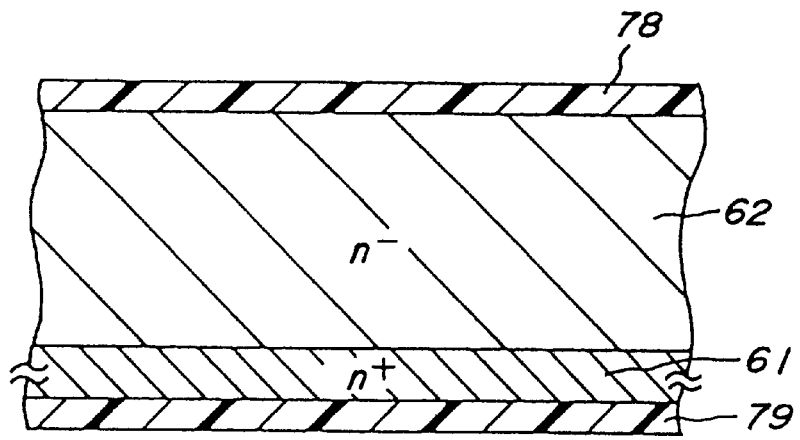
FIG._44
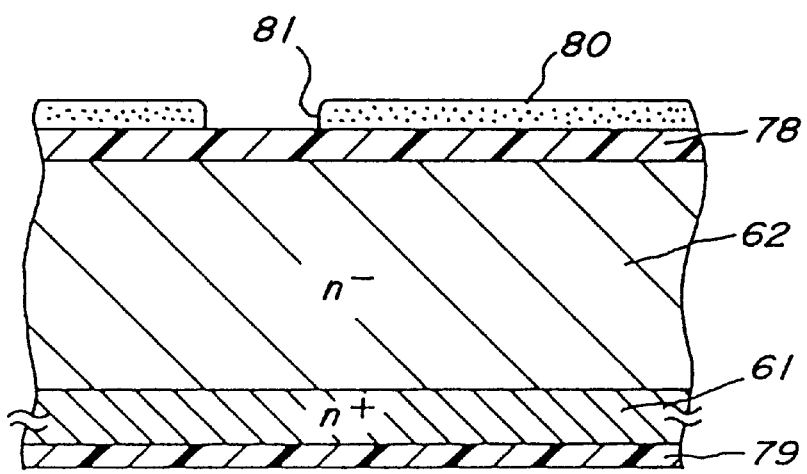
FIG._45
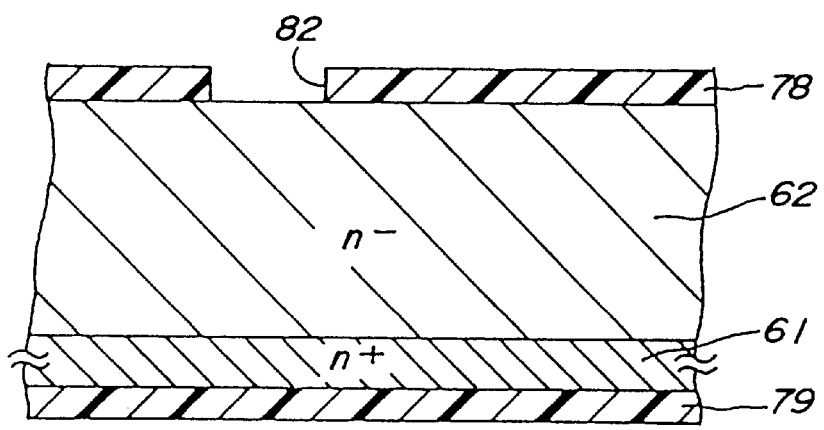

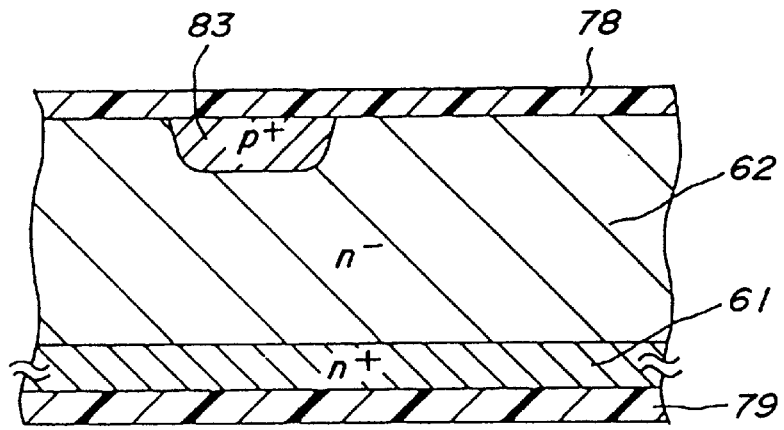
FIG_46
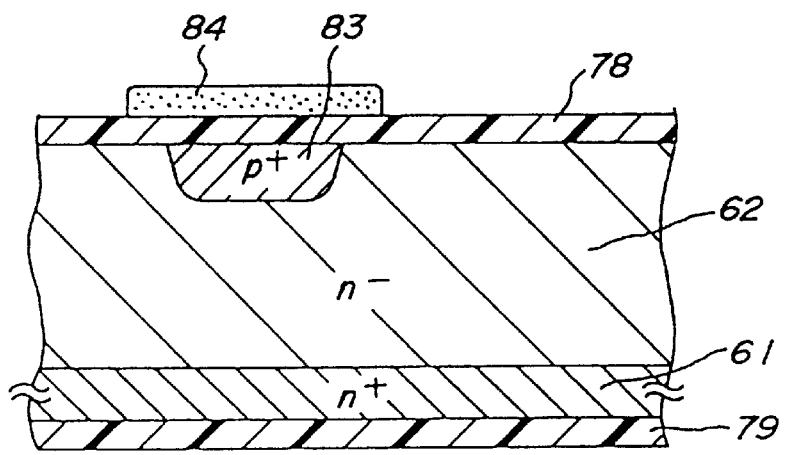
FIG_47
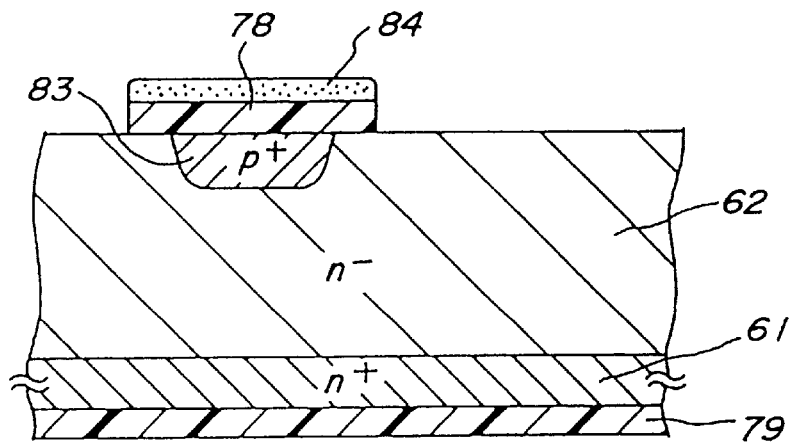
FIG_48

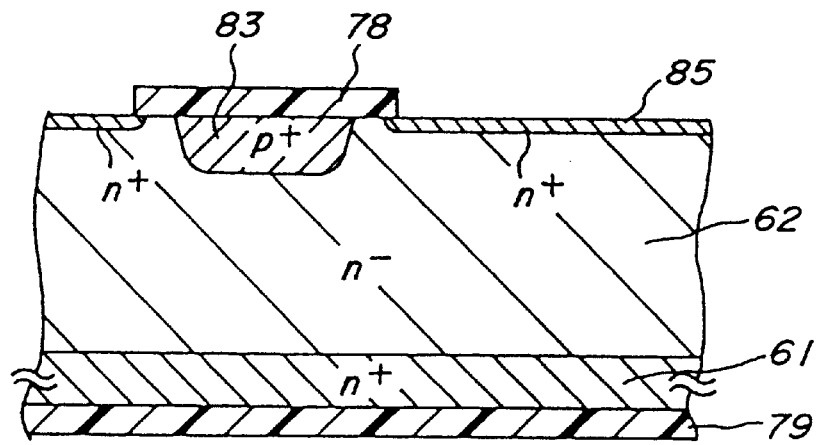
FIG_49
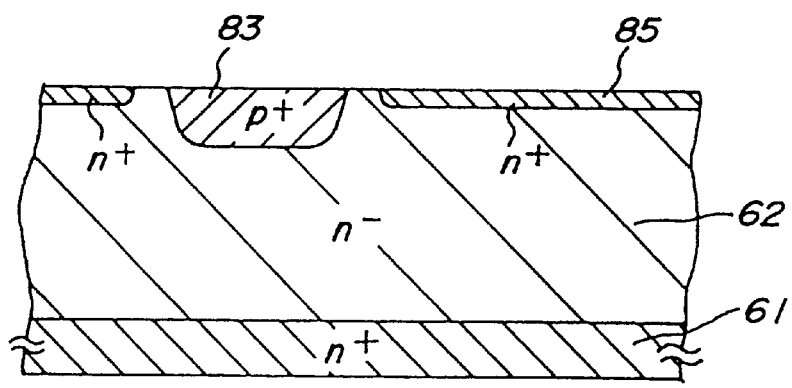
FIG_50
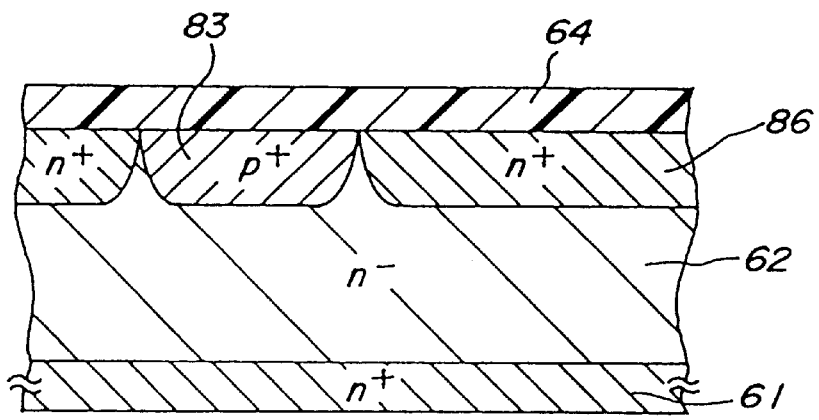
FIG_51

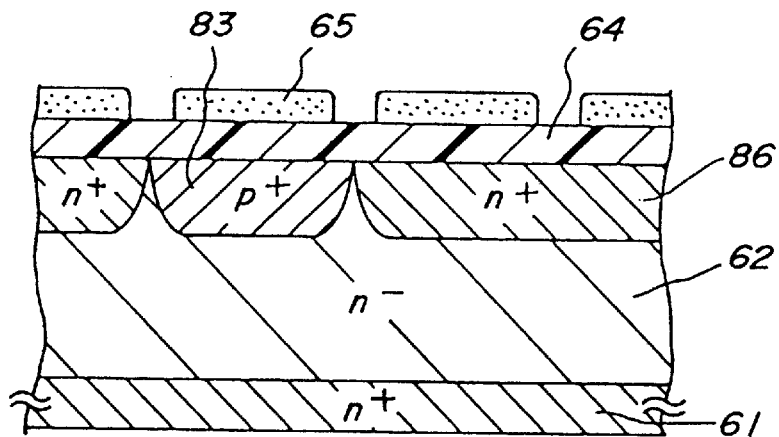
FIG_52
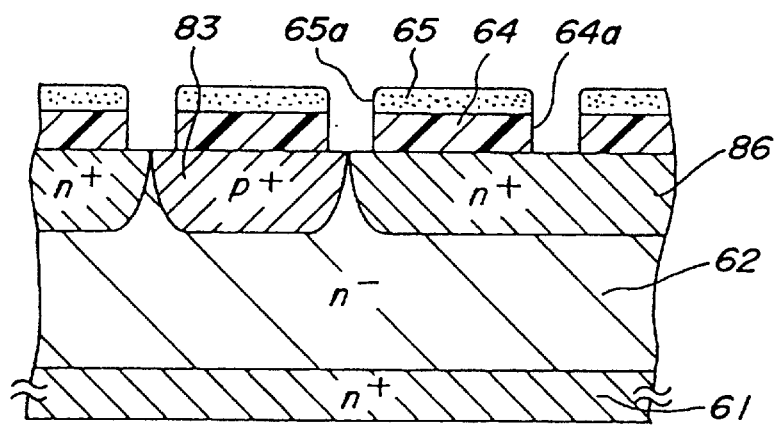
FIG_53
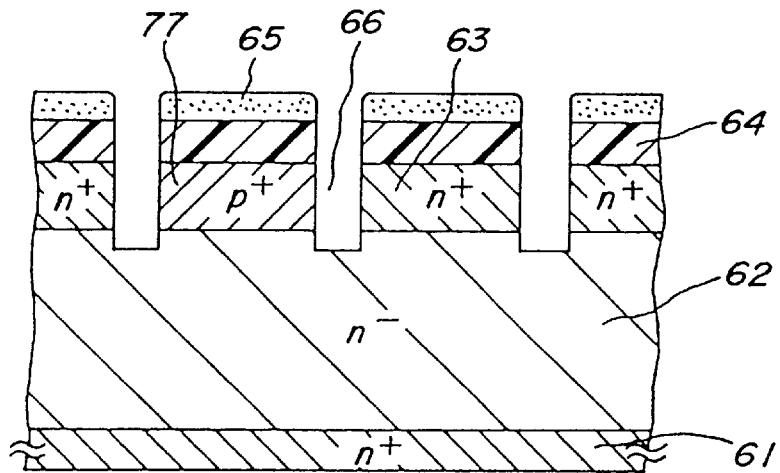
FIG_54

SEMICONDUCTOR DEVICE AND PROCESS FOR MANUFACTURING THE SAME

FIELD OF THE INVENTION

The present invention relates to a semiconductor device and a method of manufacturing the same, and more particularly to a lateral type semiconductor device such as power MOSFET, IGBT, GTO, SIT and SI thyristor, wherein a gate structure is formed in a depressed portion having a particularly large aspect ratio (length/width ratio), that is the depressed portion has a larger depth than a width, and a method of manufacturing such a lateral type semiconductor device.

TECHNICAL BACKGROUND

The power semiconductor device of the kind mentioned above has been widely used as a power supply device, and has been described in the following literatures.
1. Junichi Nishizawa: "High power-lateral junction FET of the character of a triode", Nikkei Electronics, 50~61, Sep. 27, 1971
2. J. Nishizawa, T. Terasaki, and J. Sibata: "Field-Effect Transistor versus Analog Transistor (Static Induction Transistor)", IEEE Trans. on Electron Device, ED-22(4), 185 (1975)
3. J. Nishizawa and K. Nakamura: Physiquee Appliquee, T13, 725 (1978)
4. J. Nishizawa and Y. Otsubo: Tech. Dig. 1980 IEDM, 658 (1980)
5. Junichi Nishizawa, Tadahiro Omi, Moken Sha, and Kaoru Hontani: "Denshi-Tsushin Institute Technical Research Report", ED81–84 (1981)
6. M. Ishidoh et al: "Advanced High Frequency GTO", Proc. ISPSD, 189 (1988)
7. B. J. Baliga et al: "The Evolution of Power Technology", IEEE Trans. on Electron Device, ED-31, 157 (1984)
8. M. Amato et al: "Comparison of Lateral and Vertical DMOS Specific On-resistance", IEDM Tech. Dig., 736 (1985)
9. B. J. Galiga: "Modern Power Device", John Wiley Sons, 350 (1987)
10. H. Mitlehner et al: Proc. ISPSD, 289 (1990): "A Novel 8 kV Light-Trigger Thyristor with Over Voltage Self Protection"

The miniaturization of a semiconductor device has been effected in accordance with a progress in the high performance and low consumption of electric power, and thus the formation of a recessed portion having a high aspect ratio has been required. For instance, in order to form field-limiting rings, element separation regions and via holes in an insulated layer, and to manufacture power semiconductor devices having a notched gate structure such as a static induction (SI) thyristor, it is necessary to form a trench structure having a high aspect ratio.

The selective etching has been generally used to form the trench structure. The etching is roughly classified into isotropic etching and anisotropic etching. The isotropic etching includes wet-etching and dry-etching, and the wet-etching has an advantage, in general, that the etching speed is higher than that of the dry etching. A solution of hydrogen fluoride and nitric acid is generally used as an etching solution for the isotropic wet-etching of a silicon substrate, while a mask made of silicon oxide ($SiO_2$), silicon nitride ($Si_3N_4$), and silicon oxynitride (SiNO) is used.

The isotropic etching can be mainly obtained in thermally non-equilibrium of a plasma excited gas. In this case, it is known that a trench structure of a higher aspect ratio can be obtained by optimizing gas composition, gas pressure, and substrate temperature.

The above isotopic etching has a high etching speed but has s demerit that the aspect ratio could not be made high, because in case of effecting deep etching, an etching in a lateral direction is carried out underneath the mask to a substantially same extent as the etching in the depth direction.

Thus, in the past, the isotropic etching has been widely used to form the trench structure having a high aspect ratio. However it is actually impossible to form the trench structure having a depth of more than ten μms, because the isotropic etching has a low etching speed. By conducting the isotropic etching for a long time, it is theoretically possible to obtain a deep recess, but it is actually difficult to perform the etching process for a long time because the consumption of the mask is increased during a long etching so that the structure of a desired profile could not be obtained and a throughput becomes low.

The above problem will be described in more detail with reference to an example in which an SI thyristor is manufactured as one of the power semiconductor devices with the notched gate structure. FIG. 1 shows a conventional notched gate structure formed by the isotropic etching. On one surface of an N-type silicon substrate 1 there is formed a p-type anode region 2 by diffusing p-type impurities, and an anode electrode 3 is formed on the anode region. On the other surface of the silicon substrate 1 there is formed a cathode region 4 by diffusing a large amount of n-type impurities, and a cathode electrode 5 is formed on the cathode region. A recess 6 having a width $W_G$ is formed in the surface of the silicon substrate 1 and a gate region 7 is formed by diffusing p-type impurities from the bottom of the recess into the silicon substrate, and on the bottom surface of the recess a gate electrode 8 is formed to be contacted with the gate region.

The anisotropic etching has an advantage that the width W1 of the cathode region 4 is not practically narrowed because it does not practically includes the lateral etching. If the recess 6 is formed by the isotropic etching, a width W1 of the cathode region 4 becomes narrower due to the etching in the lateral direction, and therefore a ratio of a channel area to a whole surface area becomes smaller and a current capacity becomes smaller. It is generally desired that the width W1 is about 20 μms. Meanwhile a width W2 of the channel, that is, a distance between adjacent gate diffusion regions 7 is preferably about 3~5 μms. The above condition is satisfied by using the dry-anisotropic etching. But the long etching is required to form the deep recess 6 and it is difficult to form a recess having a depth not less than 10 μms due to the fact that the mask might be etched away during a long etching. Furthermore, during the formation of the $p^+$ type gate region, the impurities doped in both the cathode region 4 and $p^+$ type gate region are diffused inwardly into the silicon substrate 1, and a distance D1 between the gate region 7 and a boundary surface 9 of the $n^+$ type cathode region and the $n^-$ type silicon substrate becomes shorter. The distance D1 is preferably not less than 5 μms, in general, but the distance becomes shorter to about 3~5 μms by thermal diffusion of impurities into the $p^+$ type gate region in shallow etching depth of the recess 6. The smaller distance D1 has a disadvantage that the gate breakdown voltage might be lowered and the large current could not be cut off.

As mentioned above, the isotropic etching makes the etching time shorter, but does not make the current capacity larger because a ratio $W1/W_G$ of the width W1 of the cathode region 4 to the width $W_G$ of the recess 6 is smaller.

Now a GTO thyristor as one of the power semiconductor devices having a mesa-type structure will be described more in detailed. FIG. 2 shows a conventional mesa-type structure formed by the anisotropic etching. A p-type emitter region 102 is formed on one surface of an n⁻ type silicon substrate 101 by diffusing p-type impurities and an anode electrode 103 is formed on the emitter region. A cathode region 104 is formed on the other surface of the silicon substrate 101 by diffusing a large amount of n-type impurities and a cathode electrode 105 is formed on the cathode region. A recess 106 having a width $W_G$ is formed in the surface of the silicon substrate 101, and a gate electrode 108 is formed on the bottom surface of the recess to be contacted with a p-type base region 107.

When the recess 106 is formed by the anisotropic etching, there is an advantage that the width W1 of the cathode region 104 does not practically become narrower because the anisotropy etching does not have the lateral etching. However, when the recess 106 is formed by the isotropic etching, the width W1 of the cathode 104 becomes narrower due to the lateral etching, and thus a ratio of the channel area to a whole surface area becomes smaller and the current capacity becomes smaller. In general, the width W1 is preferably about 5–20 $\mu$ms. On the other hand, it is preferable to make a width $W_G$ of the gate as narrow as possible to such an extent that a current can be drawn from the gate in order to increase a portion through which a main current flows. These conditions could be satisfied by the anisotropic etching. However it is difficult to form the recess having a depth not less than 10 $\mu$ms due to the fact a mask material might be etched for a long etching required to form the deep recess.

Like as the above mentioned SI thyristor, the isotropic etching makes etching time shorter, but a W1/$W_G$ ratio of the width W1 of the cathode 104 to the $W_G$ of the recess 106 might become smaller and a large current capacity could not be obtained.

In the isotropic etching and anisotropic etching the depressed portion 6 and the recess 106 of the conventional SI thyristor and GTO thyristor has a cross sectional configuration formed by a single curve.

Moreover, in the conventional static induction type semiconductor device, when a part of the gate region is short-circuited with the cathode region, the channel region could not be pinched-off with a reverse bias voltage because the gate current for the turn-off is bypassed through the short-circuited region. That is to say, carriers existent within the n– type region (including the channel region) at turn-off could not be swept out due to the short-circuit of the gate region to the cathode region. Therefore, in the semiconductor device of the large diameter, an influence of a gate resistance between the gate electrode and a point of a lead wire to the gate electrode could not be neglected. Consequently a large current could not be intercepted at a high speed due to a voltage drop by a gate current of the carrier flowing from the gate region to the point of the lead wire to the gate electrode at turn-off. Moreover, if an operation speed is increased by controlling lifetime of carriers, on-resistance might be increased and a conduction loss might occur.

Consequently, it is an object of this invention to solve the above mentioned problems of conventional semiconductor devices and known methods of manufacturing the same and to provide a semiconductor device with a recessed portion having a high aspect ratio and a method of manufacturing such a semiconductor device easily and precisely.

It is another object of the invention to provide a semiconductor device which can be miniaturized and can flow a larger current by increasing a ratio of a cross sectional area of a channel to a whole surface area of a semiconductor substrate.

It is still another object of the invention to provide a semiconductor device having an improved switching speed by drawing out residual carriers quickly at turn-off.

SUMMARY OF THE INVENTION

According to the invention, a semiconductor device having a recessed portion formed in one surface of a semiconductor substrate and a gate structure for controlling a current flowing between surfaces of the semiconductor substrate formed in the recessed portion, characterized in that a cross sectional configuration of the recessed portion is composed of two or more than two curves having different curvatures.

In this semiconductor device, the cross sectional configuration of the recessed portion formed in the surface of the semiconductor substrate is preferably composed of one or more curves formed by the isotropic etching and one or more curves formed by the anisotropic etching.

According to the invention, a method of manufacturing a semiconductor device, characterized in that a recessed portion having a high aspect ratio is formed by repeating an isotropic etching step and an anisotropic etching step at least one time.

The last etching step is preferably the isotropic etching step in the above mentioned series of etching steps. When the isotropic etching step is the last etching process, the area of the recessed portion formed in the semiconductor substrate can be increased. Therefore, when the semiconductor device is formed as the above explained power semiconductor device having the notched gate structure, a large gate region can be formed, and the channel region formed between adjacent gate regions can be made narrower so that a ratio of a cathode region area to a whole surface area can be increased.

Moreover, according to the invention, a semiconductor device is characterized in that a semiconductor substrate includes a recessed portion with an overhang portion, and the overhang portion is covered with an insulating film formed by an oxide layer, a nitride layer, an oxynitride layer or any combination thereof.

In the method of manufacturing a semiconductor device according to the invention, it is preferable to form a depressed portion in a silicon substrate, while a mask layer for the isotropic etching and anisotropic etching is formed by a silicon oxide film, a silicon nitride film, a silicon oxynitride film, or an combination thereof. Furthermore, a recessed portion may be formed, for instance, in an inter-layer insulated film.

In the method of manufacturing a semiconductor device according to the invention, a mask layer having an opening formed at a portion at which a recessed portion is to be formed is formed on a surface of a semiconductor substrate and a recessed portion having a high aspect ratio is formed by repeating isotropic etching step and anisotropic etching step alternately at least one time. Then, a self-aligned structure can be obtained and errors resulting in stacking errors of a plurality of masks can be eliminated when as above mentioned isotopic etching step and anisotropic etching step are carried out under the same mask. However, in this case, the mask layer should have a sufficiently large thickness by taking into account of a possible consumption of a mask material during repeating etching steps.

According to the invention, a semiconductor device is characterized in that it comprises a semiconductor substrate of one conductivity type, recessed portions formed in one surface of the semiconductor substrate, each having an overhang portion, plural mesa-type regions of high aspect ratio formed between adjacent recessed portions, a source region of the one conductivity type formed in at least one of the mesa-type regions, a source short-circuit region of the other conductivity type formed in at least one of the mesa-type regions, gate regions of the other conductivity type formed along the recessed portions, insulating films formed on inner surfaces of said recessed portions to separate the gate regions, a source electrode formed on the one surface of the semiconductor substrate to be electrically contacted with the source region and source short-circuit region, a drain region of the one conductivity type formed on the other surface of the semiconductor substrate, and a drain electrode formed on the surface of the drain region.

Such a semiconductor device is constructed as MOSFET and a ratio of a cross sectional area of the source region, which is formed in the mesa-type region having the overhang portion, to a whole surface area of the semiconductor substrate is large, so that a large current capability can be obtained and a high speed operation can be obtained because carriers in the gate region can be swept out to the source electrode through the source short-circuit region at a turn-off.

According to the invention, a semiconductor device is characterized in that it comprises a semiconductor substrate of one conductivity type, first and second groups of recessed portions formed on one surface of the semiconductor substrate, each having an overhang portion, plural mesa-type regions of high aspect ratio formed between adjacent first and second groups of recessed portions, emitter regions of the one conductivity type formed on the surfaces of the mesa-type regions, gate regions of the other conductivity type formed along the first and second groups of recessed portions, first insulated layers formed on the inner surface of the first group of recessed portions to separate the gate regions, second insulated layers formed on the inner surface of the second group of recessed portions, gate electrodes formed in the first group of recessed portions, conducting regions formed in the second group of recessed portions to be electrically contacted with the gate regions through openings formed in the second insulating layer, an emitter electrode electrically contacted with the emitter regions and with the conducting regions formed in the second group of recessed portions, a collector region of the other conductivity type formed on the other surface of the semiconductor substrate, and a collector electrode formed on the surface of the collector region.

Such a semiconductor device is composed as IGBT and a ratio of the cross sectional area of the source region, which is formed in the mesa-type region of the overhang portion, to a whole surface area of the semiconductor substrate is large, so that a large current can be obtained, and a high speed turn-off operation can be attained due to a fact that carriers in the gate region can be swept out into the emitter electrode through the conducting region at turn-off.

In a preferable embodiment of the semiconductor device according to the invention, an emitter short-circuit region of the other conductivity type is formed on the surface of the mesa-type region formed between adjacent first group of recessed portions and the emitter short-circuit region is connected to the emitter electrode. Then, a higher speed turn-off operation can be obtained because carriers are swept out through the emitter short-circuit region and at the same time carriers are swept out through the above mentioned conducting region.

BRIEF DESCRIPTION OF THE DRAWINGS

FIG. 1 is a cross sectional view showing SI thyristor manufacturing by the conventional method.

FIG. 2 is a cross sectional view of the mesa-type GTO thyristor manufacturing by the conventional method.

FIG. 4 is a cross sectional view showing a first step of manufacturing bonded-type SI thyristor by the method according to this invention.

FIG. 5 is a cross sectional view showing a next step.

FIG. 6 is a cross sectional view showing a next step.

FIG. 7 is a cross sectional view showing a next step.

FIG. 8 is a cross sectional view showing a next step.

FIG. 9 is a cross sectional view showing a next step.

FIG. 10 is a cross sectional view showing a next step.

FIG. 11 is a cross sectional view showing a next step.

FIG. 12 is a cross sectional view illustrating the structure of a completed SI thyristor.

FIG. 13 is a cross sectional view depicting another embodiment of SI thyristor according to the invention.

FIG. 14 is a cross sectional view showing still another embodiment of SI thyristor according to the invention.

FIG. 16 is a cross sectional view showing a first step of manufacturing bonded-type GTO thyristor by the method according to the present invention.

FIG. 17 is a cross sectional view showing a next step.

FIG. 18 is a cross sectional view showing a next step.

FIG. 19 is a cross sectional view showing a next step.

FIG. 20 is a cross sectional view showing a next step.

FIG. 21 is a cross sectional view showing a next step.

FIG. 28 is a cross sectional view showing a next step.

FIG. 29 is a cross sectional view showing a next step.

FIG. 30 is a cross sectional view showing a next step.

FIG. 31 is a cross sectional view showing a next step.

FIG. 32 is a cross sectional view showing a next step.

FIG. 33 is a cross sectional view showing a next step.

FIG. 34 is a cross sectional view showing a next step.

FIG. 35 is a cross sectional view showing a next step.

FIG. 36 is a cross sectional view showing a next step.

FIG. 37 is a cross sectional view showing a next step.

FIG. 38 is a cross sectional view showing a next step.

FIG. 39 is a cross sectional view showing a next step.

FIG. 40 is a cross sectional view showing a next step.

FIG. 41 is a cross sectional view depicting the structure of a completed MOSFET.

FIG. 43 is a cross sectional view showing a first step of manufacturing MOSFET shown in FIG. 42.

FIG. 44 is a cross sectional view showing a next step.

FIG. 45 is a cross sectional view showing a next step.

FIG. 46 is a cross sectional view showing a next step.

FIG. 47 is a cross sectional view showing a next step.

FIG. 48 is a cross sectional view showing a next step.

FIG. 49 is a cross sectional view showing a next step.

FIG. 50 is a cross sectional view showing a next step.

FIG. 51 is a cross sectional view showing a next step.

FIG. 52 is a cross sectional view showing a next step.

FIG. 53 is a cross sectional view showing a next step.

FIG. 54 is a cross sectional view showing a next step.

DESCRIPTION OF PREFERRED EMBODIMENTS

FIG. 3 represents cross sectional views showing successive steps in the method of manufacturing a semiconductor device according to this invention. Referring to FIG. 3A, a first oxide layer 12 is formed on a region of a semiconductor device at which a recessed structure is to be formed, i.e. on one surface of a semiconductor substrate 11, and a photoresist layer 13 is formed on this oxide layer. A part of the photoresist layer at which a recessed portion is to be formed is selectively removed by conventional exposure and developing so that an opening 13a is formed.

Figure 3A:
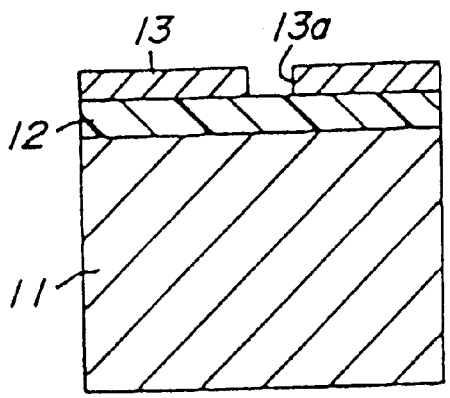
FIGS. 3A–3H are cross sectional views of explaining the fundamental conception of the method of semiconductor device according to the invention.
Figure 3B:
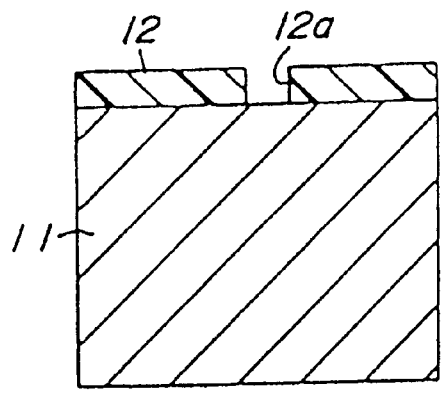
Figure 3C:
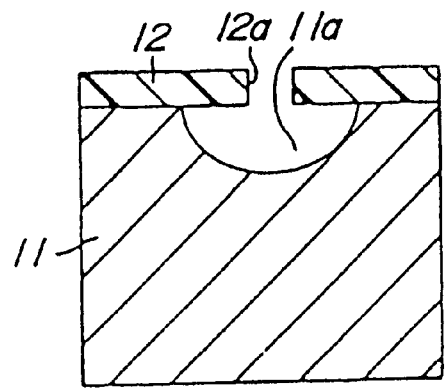

Subsequently as shown in FIG. 3B, an opening 12a is formed in the first oxide layer 12 by etching the oxide layer through the opening 13a of the photoresist layer 13. In FIG. 3C, a first recessed portion 1a is formed in the semiconductor substrate 11 by the isotropic wet-etching the substrate through the opening 12a of the first oxide layer. The speed of the isotropic wet-etching is so high that an etching time is short. The recessed portion 11a is also formed in a lateral direction under the first oxide layer 12 because the substrate is isotropically etched both in a depth direction and lateral direction at the same time.

Figure 3D:
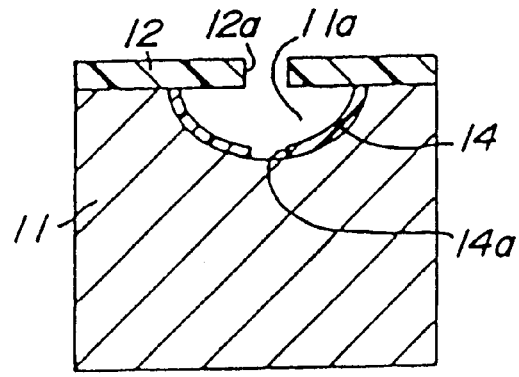
Figure 3E:
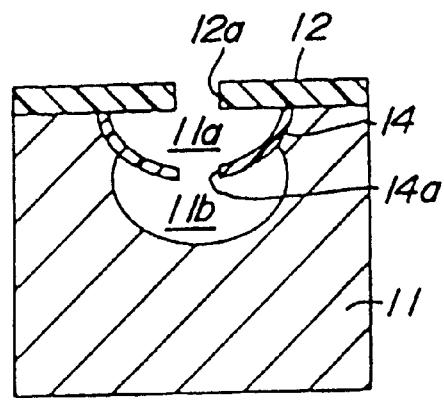
Figure 3F:
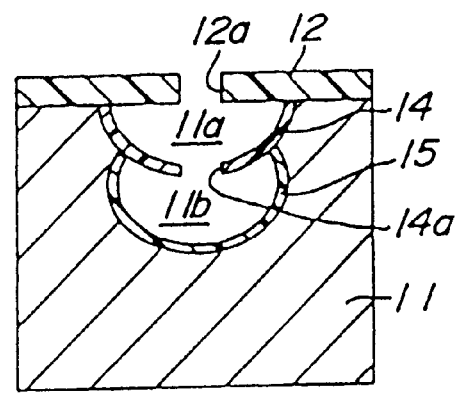
Figure 3G:
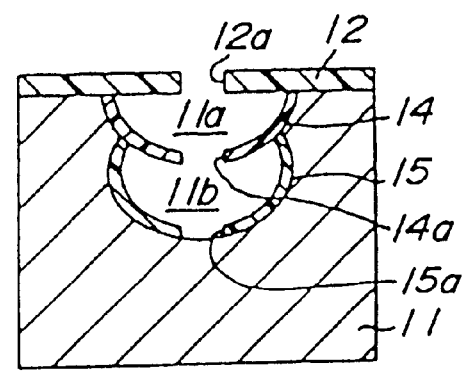
Figure 3H:
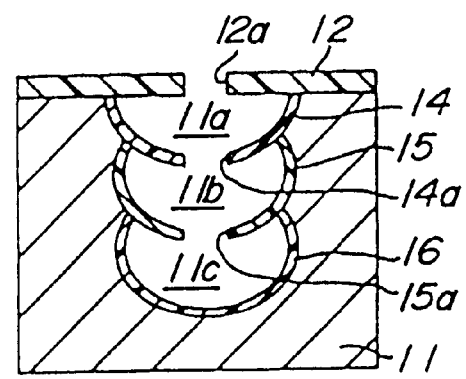

Next, as illustrated in FIG. 3D, a second oxide layer 14 is formed on the surface of the recessed portion 11a and opening 14a is formed in the second oxide layer 14 by the anisotropic etching the oxide layer through the opening 12a formed in the first oxide layer 12. Then, as shown in FIG. 3E, a second recessed portion 11b is formed in the semiconductor substrate by the isotropic etching the substrate through the opening 14a of the second oxide layer 14. As shown in FIG. 3F, after forming a third oxide layer 15 on the bottom surface of the second recessed portion 11b, an opening 15a is formed by anisotropically etching the oxide layer again as depicted in FIG. 3G. This etching process can be done by self-alignment because the first and second oxide layers 12 and 14 having the opening 12a and 14a, respectively operate as a mask. Furthermore, as shown in FIG. 3H, a third recessed portion 11c is formed by conducting the isotropic etching through the opening 15a formed in the third oxide layer 15.

By performing the isotropic etching and anisotropic etching alternately in a repetitive manner, the recessed portion can be extremely deeper and can have a very high aspect ratio because the etching in the lateral direction is limited to that caused by a single isotropic etching. The etching process can be done by self-alignment so that any alignment error due to a mis-alignment of a plurality of masks can be eliminated and the dimension accuracy becomes excellent because the isotropic etching and the anisotropic etching are effected on a basis of the opening 12a formed in the first oxide layer 12.

The first oxide layer 12 having the opening 12a serves as a common mask for all anisotropic etching steps and the thickness is gradually decreasing due to the etching. Therefore, an initial thickness of the first oxide film has to be sufficiently large enough that the first oxide film can still serve as the mask in the last etching step.

As shown in FIG. 3, the semiconductor device of this invention is characterized in that the recessed portion is composed of plural curves having different curvatures. That is to say, the recessed portion is composed of the recessed portions 11a, 11b, and 11c formed by the isotropic etching steps, oxide layers 14 and 15 and boundaries of the openings 14a and 14b formed by the anisotropic etching steps, these recessed portions and the boundaries of the openings have different curvatures. It should be noted that the curvatures of the recessed portions 11a, 11b, and 11c may be same or different.

In order to eliminate the drawback of the known notched gate structure, the inventors have suggested a bonded-type power semiconductor device. In this semiconductor device, a recessed portion is formed in one surface of a first semiconductor substrate and a gate region is formed at the bottom of the recessed portion by diffusion, and a second semiconductor substrate is bonded to the first semiconductor substrate such that the recessed portion is closed after a gate electrode is formed on the gate region. Upon manufacturing such a bonded-type semiconductor device, an aspect ratio of the recessed portion to be formed in one surface of the semiconductor substrate must be large to miniaturize the semiconductor device and to treat a large current. Now an embodiment of the method according to the invention applied to an SI thyristor as one of the bonded-type semiconductor devices will be described.

At first, as illustrated in FIG. 4, on one surface of an $n^-$ type silicon substrate 21, is formed a $p^+$ type anode region 22 by introducing p-type impurities into the substrate, and then an $n^{++}$ type junction region 23 is formed on the other surface of the semiconductor substrate by introducing n-type impurities into the substrate. An impurities concentration of the $n^-$ type silicon substrate 21 may be $10^{12}$–$10^{15}$ atom/cm$^3$ and an impurities concentration of the junction region 23 may be $10^{18}$–$10^{21}$ atom/cm$^3$.

Next as depicted in FIG. 5, a silicon oxide layer 24 is formed on the $n^{++}$ type region 23 and openings 24a are formed by photolithography in the silicon oxide layer at positions at which a trench structure is to be formed later. Subsequently, the isotropic etching is carried out through the openings formed in the silicon oxide layer 24 to form recessed portions 25 such that the recessed portions extend into the $n^-$ type silicon substrate 21 through the $n^{++}$ type junction region 23 as shown in FIG. 6.

Then, as illustrated in FIG. 7, silicon oxide layers 26 are formed on the inner surfaces of the recessed portions 25, and openings 26a are formed by removing the silicon oxide at the bottoms of the recessed portions by the anisotropic etching, while the silicon oxide layer 24 having the openings 24a is used as a mask. Then, recessed portions 27 are formed by performing the isotropic etching through the openings 26a of the silicon oxide layer 26 as shown in FIG. 8. It should be noted that during this etching, a distance W1 between adjacent recessed portions 25, that is, a width of the emitter region is not decreased. The isotropic wet-etching has an advantage that its etching time is shorter than that of the anisotropic wet-etching.

Next, as shown in FIG. 9, the whole surface is oxidized to cover the recessed portions 27 with oxide layers 28. Subsequently, portions of the oxide layers 28 at the bottoms of the recessed portions are removed by the anisotropic etching, while the oxide layers 24 and 26 are used as masks. Thereafter, as depicted in FIG. 10, $p^+$ type gate regions 29 are formed by diffusing p-type impurities into the substrate from the openings of the recessed portions 27. In this case, the wide gate regions 29 can be formed in the silicon substrate because the recessed portions 27 are formed by the isotropice-etching as above mentioned.

Since the bonded-type SI thyristor is to be manufactured in this embodiment, the $n^{++}$ type junction regions 23 are exposed by removing the mask layer 24 and junction regions 23 are bonded to one surface of an $n^+$ type second silicon substrate 35 as shown in FIG. 11. A cathode contact region 31 is formed in the other surface of the second silicon substrate 35 by introducing a large amount of n-type impurities. In this manner, the SI thyristor structure can be obtained by bonding the first silicon substrate 21 and second silicon substrate 35 to each other. The bonding may be conducted under pressure and heat.

After bonding the first silicon substrate 21 and second silicon substrate 35 to each other, a cathode electrode 32 is formed on the cathode contact region 31 formed in the second silicon substrate 35 and an anode electrode 33 is formed on the $p^+$ type anode contacting region 22 formed in the other surface of the first silicon substrate 21 as shown in FIG. 12. The cathode electrode 32 and anode electrode 33 are formed by evaporating aluminum, for example. During heating treatments after bonding the first silicon substrate 21 and second silicon substrate 35 to each other, n-type impurities are diffused from the $n^{++}$-type junction regions 23 into the surface of the second silicon substrate 35 to form an $n^+$-type junction region 34. In this manner, the junction regions 23 and 34 having a large amount of impurities doped therewith are formed at a boundary between the first and second semiconductor substrates 21 and 35, and thus an ohmic-contact of low resistance can be obtained, a probability of tunneling effect is higher, a power loss due to the contact resistance, and a possibility of destruction due to heat is decreased. During the above heat treatment, portions of the surface of the second silicon substrate 35 exposing to the recessed portions are oxidized so that oxide layers are formed.

It should be noted that if the second semiconductor substrate having an impurity concentration of not less than $10^{19}$ atom/cm$^3$ is used, it is not necessary to form the $n^{++}$ type junction region 23 on the surface of the first silicon substrate 21.

Figure 15:
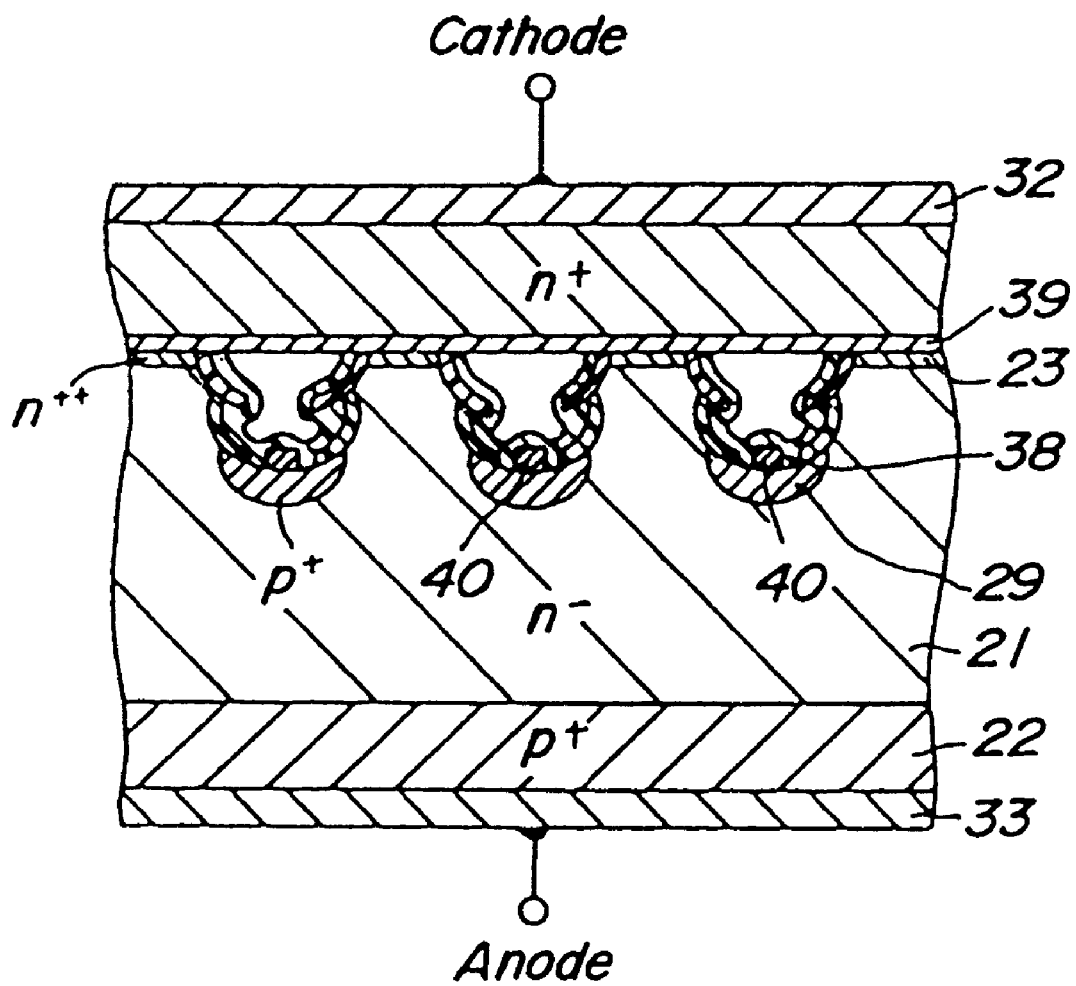
FIG. 15 is a cross sectional view representing further embodiment of SI thyristor according to this invention.

FIGS. 13–15 show several embodiments of the SI thyristor according to the present invention. In the embodiment shown in FIG. 13, instead of the $n^+$ second silicon substrate 35, use is made of an $n^-$-type silicon substrate 36 having highly doped $n^{++}$ junction regions 34 formed in the contact surface and an $n^+$ cathode contact region 31 formed in the other surface. The remaining structure is identical with that of the previous embodiment. In the embodiment illustrated in FIG. 14, a metal substrate 37 is used instead of the $n^+$ type second silicon substrate 35. In the embodiment depicted in FIG. 15, a metal layer 39 is formed on the surface of the $n^+$-type silicon substrate 35 and is bonded to the first silicon substrate 21. Moreover in this embodiment, gate electrodes 40 are formed such that they are contacted with the gate regions 29 formed at the bottoms of the recessed portions 27. In the embodiments shown in FIGS. 14 and 15, insulated layers 38 are formed to cover the gate regions 29, silicon oxide layers 26 and 28, and gate electrodes 40. The insulated layer 38 may be composed of silicon oxide layer by TEOS or CVD after the gate region 29 is formed in the embodiment shown in FIG. 14 and after the gate electrode 40 is formed in the embodiment of FIG. 15. In this case, the silicon oxide layer formed on the surface of the silicon substrate 21 may be removed by polishing.

The embodiments shown in FIGS. 13–15 have an advantage over the embodiment illustrated in FIGS. 4–12 that the manufacturing process becomes simpler and a reliability is increased. Particularly, in the case of using the $n^+$-type silicon substrate 35 as the second silicon substrate, it is no more necessary to introduce a large amount of n-type impurities as compared with the case in which the $n^-$-type silicon substrate is used as the second silicon substrate. In the case of using the $n^+$-type silicon substrate 35 having the metal substrate 37 or metal layer 39, the reliability of junction can be enhanced by utilizing the plastic deformation of metal.

Now an embodiment of the method of manufacturing a semiconductor device according to the invention applied to a GTO (gate turn-off) thyristor as one of the vertical type semiconductor device will be explained.

As shown in FIG. 16, a $p^+$-type anode electrode 42 is formed by diffusing boron impurities into a rear surface of an n- silicon substrate 41 having a phosphor impurity concentration of $10^{13}$–$10^{15}$ atom/cm$^3$ with a concentration of $10^{19}$ atom/cm$^3$, a thick silicon oxide layer 43 (SiO$_2$) of about 3 $\mu$ms is formed on a surface of the silicon substrate 41 by the TEOS-CVD method.

Then, a mask layer, which is composed of photoresist having openings of width $W_o$ of 10 $\mu$ms with a pitch $W_p$ of 70 $\mu$ms, is formed on the silicon oxide layer 43, and the silicon oxide layer 43 is selectively removed by performing the anisotropic etching using the RIE method of CHF$_3$ and openings 43a having a width of 50 $\mu$ms and a pitch of 200 $\mu$ms are formed at positions at which the mesa structure is to be formed later as shown in FIG. 17. Subsequently, as illustrated in FIG. 18, by using an etchant of a mixture of HNO$_3$+HF+CH$_3$COOH and making use of the openings 43a of the silicon oxide layer 43, the silicon substrate 41 is selectively etched to form recessed portions 44 having a depth of 30 $\mu$ms by utilizing a different etching rates between the exposed silicon substrate 41 and the silicon oxide layer 43. The recessed portion has an overhang portion having a width $W_h$ of 20–30 $\mu$ms and composed of the silicon oxide layer 43.

As shown in FIG. 19, after removing the photoresist, oxide layers 45 having a thickness of about 7000 Å are formed on inner surfaces of the recessed portions 44 by performing the moisture oxidation at 1100° C. Then, openings 45a are formed in the oxide layer 45 by the anisotropic etching using RIE method of CHF$_3$ while the openings 43a formed in the silicon oxide layer 43 are used as a mask. Next, as depicted in FIG. 20, the isotropic etching is carried out to form second recessed portions 46 having a depth of 10 $\mu$ms by using the openings 45a as a mask.

Next, boron impurities are diffused from the surfaces of the second recessed portions 46 with a concentration of $10^{19}$ atom/cm$^3$ to form $p^+$gate layers 47. The introduced impurities are further driven into the silicon substrate until adjacent gate layers 47 are connected with each other. During this process, boron oxide layers 48 are formed on the whole bottom surfaces of the recessed portions 46.

Figure 22:
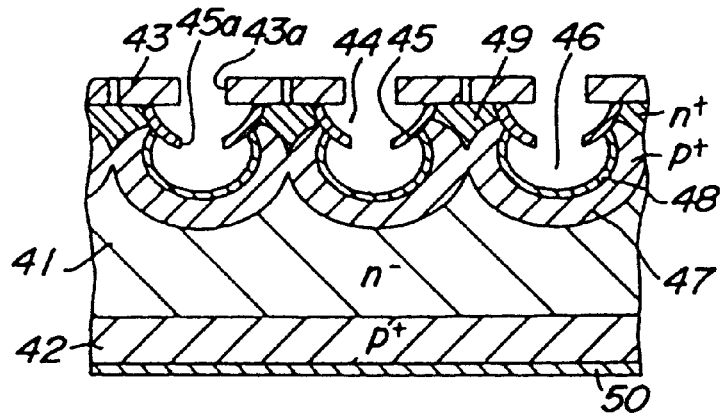
FIG. 22 is a cross sectional view showing a next step.

Then, as shown in FIG. 22, openings are formed at centers of the silicon oxide layers 43 by the wet-etching using HF+$H_2O$ and phosphor impurities are diffused into the silicon substrate 41 through the openings with an impurity concentration of $10^{20}$ atom/$cm^3$ to form $n^+$ type cathode layers 49. After that, a silicon oxide layer 50 is formed on the rear surface by oxidizing the whole assembly. In this case, the openings formed in the above mentioned oxide layers 43 are closed.

Figure 23:
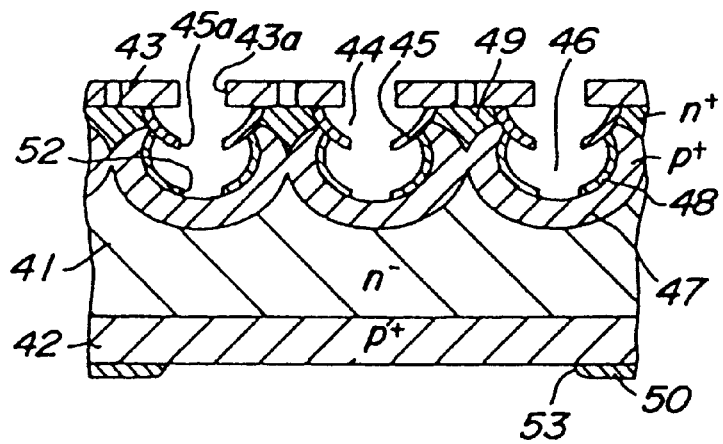
FIG. 23 is a cross sectional view showing a next step.

A mask layer of photoresist is formed on the silicon oxide layer 43 by the photolithography and the silicon oxide layer 43 is selectively etched by RIE method to form contact holes 51 in the silicon oxide layer 43, and at the same time contact holes 52 are formed in the boron oxide layers by using the openings 43a of the silicon oxide layer 43 as a mask. Thereafter, as shown in FIG. 23, an opening 53 is formed in the silicon oxide layer 50 on the anode layer 42.

Figure 24:
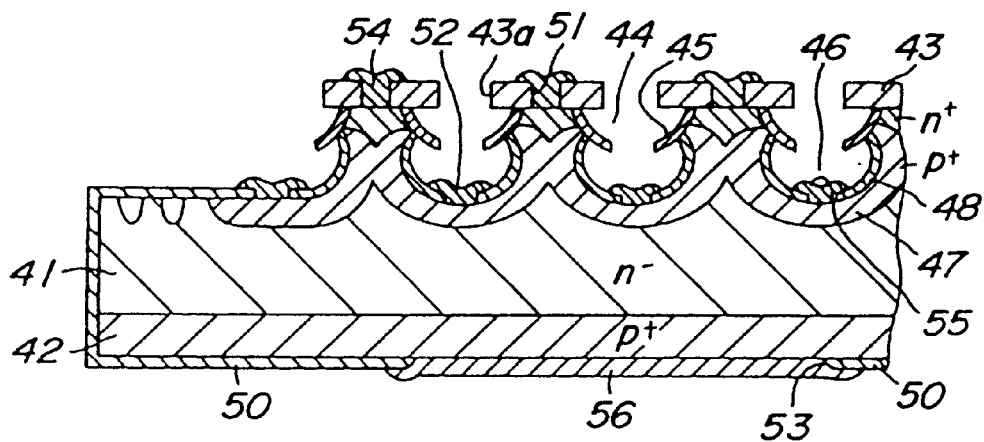
FIG. 24 is a cross sectional view illustrating the structure of a completed GTO thyristor.

Finally, as illustrated in FIG. 24, electrode patters are formed in the contact holes 51 and 52, and opening 53 by the photolithography, and thereafter aluminum layers are deposited by the evaporation to form cathode electrodes 54, gate electrodes 55, and an anode electrode 56. After that, a GTO thyristor is obtained by packaging the assembly.

Now successive steps of manufacturing a MOSFET as one of the vertical the semiconductor device according to the present invention will be described.

Figure 25:
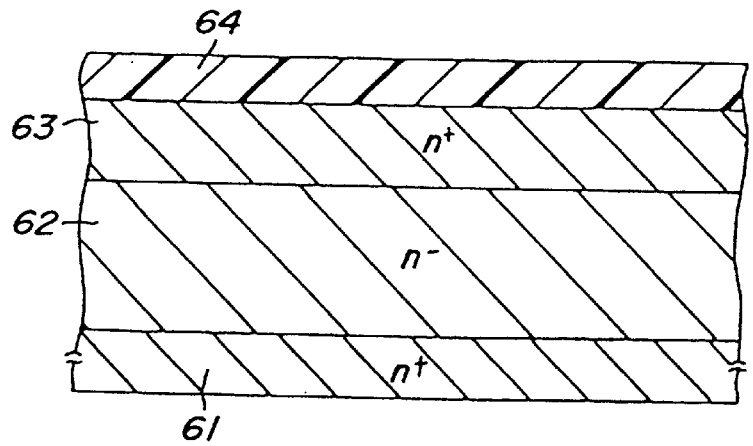
FIG. 25 is a cross sectional view showing a first step of manufacturing bonded-type MOSFET thyristor by the method according to the invention.

As shown in FIG. 25, on a silicon substrate 61 having a phosphor impurity concentration of about $10^{18}$–$10^{20}$ atom/$cm^3$ and a thickness of 400 $\mu$ms, an $n^-$ type epitaxial layer 62 having a phosphor impurity concentration of $10^{14}$–$10^{15}$ atom/$cm^3$ and a thickness of 50 $\mu$ms is formed, an $n^+$ type diffusion layer 63 having a thickness of 10 $\mu$ms is formed by diffusing phosphor impurities, and a thick silicon oxide layer 64 having a thickness of about 5 $\mu$ms is formed on the diffusion layer by the TEOS-CVD method.

Figure 26:
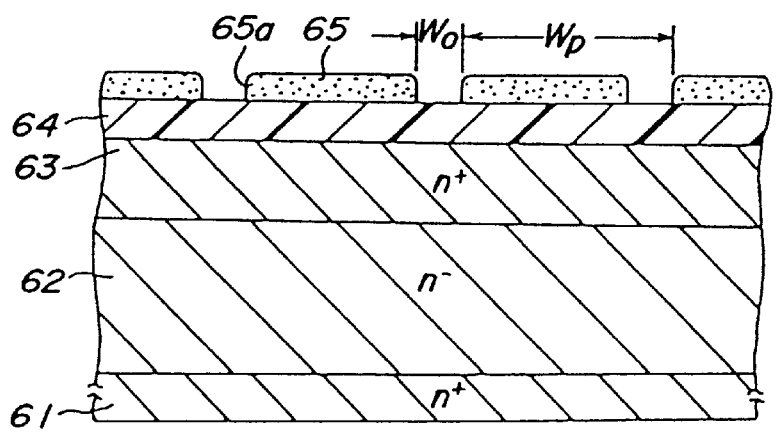
FIG. 26 is a cross sectional view showing a next step.
Figure 27:
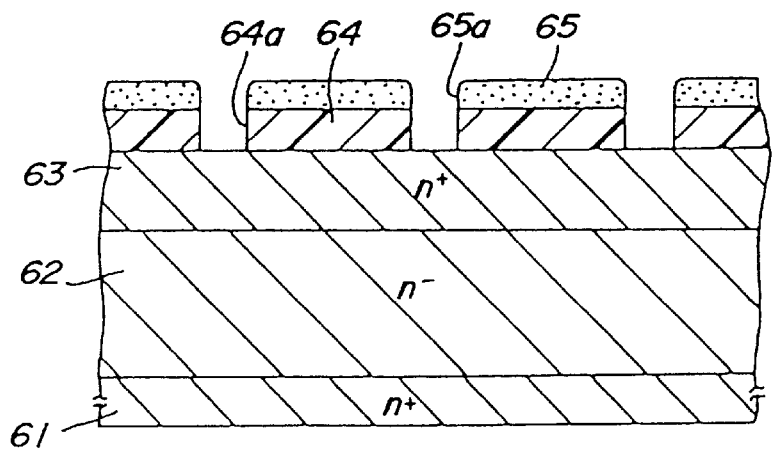
FIG. 27 is a cross sectional view showing a next step.

Then, as depicted in FIG. 26, after a photoresist layer 65 with openings 65a having a width $W_o$ of 5 $\mu$ms and a pitch $W_p$ of 20 $\mu$ms is formed on the silicon oxide layer 64, the silicon layer is selectively removed by the anisotropic etching of the RIE method using $CHF_3$ while the photoresist layer is used as a mask to form openings 64a having a width of 5 $\mu$ms and a pitch of 20 $\mu$ms as illustrated in FIG. 27. Subsequently, recessed portions 66 having a depth of 15 $\mu$ms are formed by the anisotropic etching as shown in FIG. 28, while the photoresist layer 65 and the silicon oxide layer 64 are used as a mask.

Next, as shown in FIG. 29, after removing the photoresist layer 65, a thermal oxidation is carried out to form silicon oxide layers 67 on the inner and bottom surfaces of the recessed portions 66. At the same time, a silicon oxide layer 68 is formed on the rear surface of the silicon substrate 61. Phosphor impurities in the $n^+$ type diffusion layer 63 are driven into the silicon epitaxial layer 62 deeper during the thermal oxidation treatment. As will be explained later, the diffusion layer 63 constitutes a source region.

Next, as illustrated in FIG. 30, the silicon oxide layers 67 at the bottoms of the recessed portions 66 are selectively removed by performing the anisotropic etching of the RIE method using $CHF_3$. Thus the silicon epitaxial layer 62 is exposed at the bottoms of the recessed portions 66.

Subsequently as shown in FIG. 31, second recessed portions 69 having a circular cross section are formed to be communicated with the recessed portions 66 by isotropically etching the silicon epitaxial layer 62 through the recessed portions 66.

Then as depicted in FIG. 32, a p-type gate region 70 is formed on the surface of the second recessed portions 69 by diffusing boron impurities into the epitaxially layer through recessed portions 66 and 69. Next, silicon oxide layers 67 are formed on the surfaces of the second recessed portions 69 by the thermal oxidation treatment as shown in FIG. 33. Then, the anisotropic etching of RIE method using $CHF_3$ is effected to form openings 71 a in the bottoms of the silicon oxide layers 71 as illustrated in FIG. 34, while the silicon oxide layer 67 defining the first recessed portions 66 are used as a mask. Then, the isotropic etching is performed through the openings 71a formed in the silicon oxide layer 71 to form third recessed portions 72 such that the third recessed portions reach the bulk of the silicon epitaxial layer 62 through the p-type gate region 70 as shown in FIG. 35.

After forming silicon oxide layers 73 on the surfaces of the third recessed portions 72 by the thermal oxidation as shown in FIG. 36, an aluminum layer 74 is formed by sputtering such that the first recessed portions 66, second recessed portions 69 and third recessed portions 72 are filled with aluminum as illustrated in FIG. 37.

Next, after exposing the surface of the epitaxial layer 62 is exposed by removing the aluminum layer 74 by polishing as shown in FIG. 38, the aluminum layer in the first recessed portion 66 is partially removed by etching as depicted in FIG. 39. Then, after removing the silicon oxide layer 68 formed on the rear surface of the silicon substrate 61 by the RIE method, a drain electrode 75 is formed as shown in FIG. 40.

Finally, a metal substrate 76 acting as a source electrode is bonded to the surface of the silicon epitaxial layer 62 as illustrated in FIG. 41. In the power MOSFET thus obtained, the $n^+$ diffusion region 63 acting as the source region can be easily formed by diffusion. Furthermore, since an aspect ratio of the recessed portion is large, the source diffusion region 63 can be made large and the current capability is large. Moreover, since a large parasitic capacitance is not produced between the source and the drain, a high speed operation can be realized.

Figure 42:
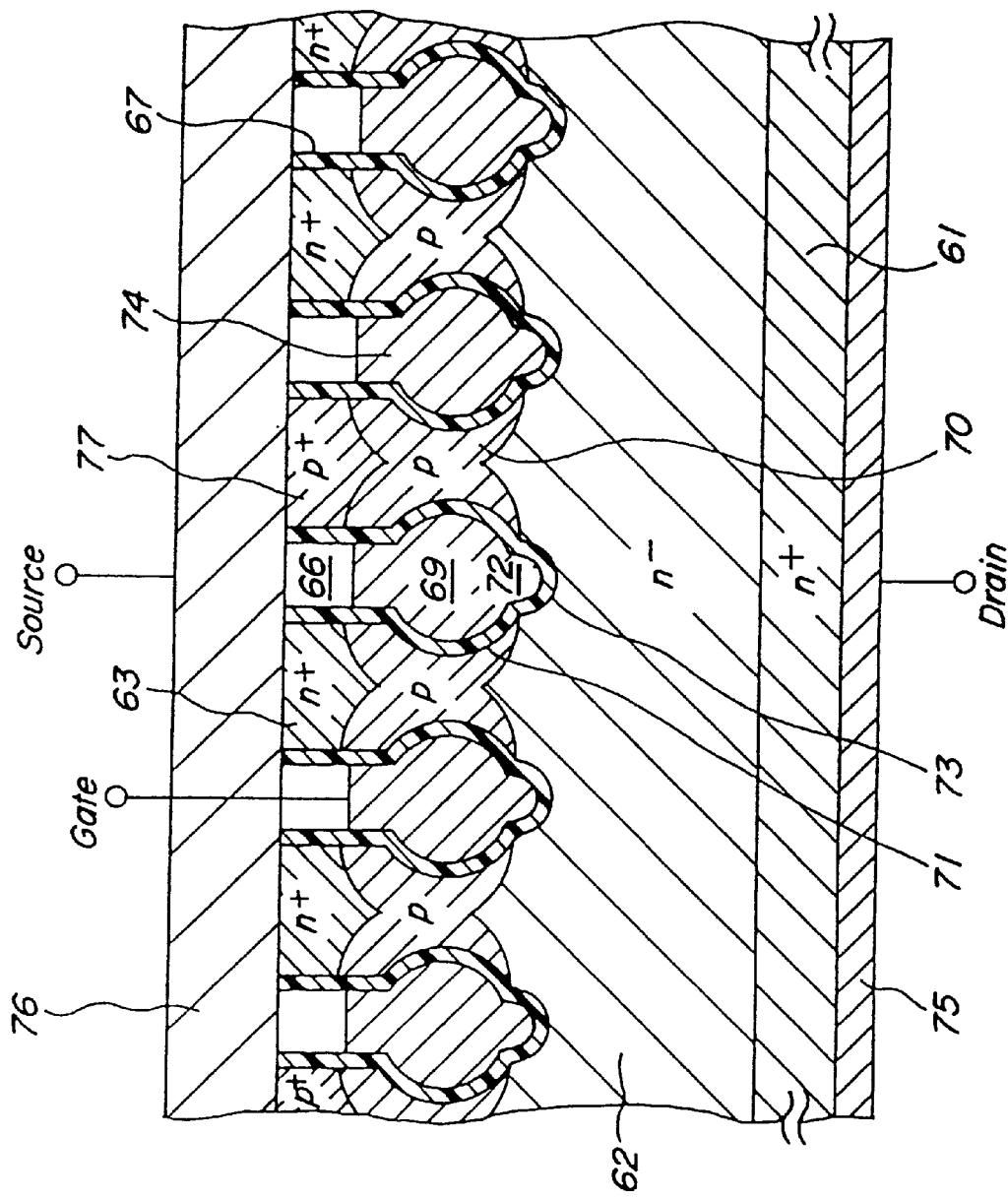
FIG. 42 is a cross sectional view illustrating the structure of MOSFET according to the invention.

FIG. 42 shows still another embodiment of the semiconductor device in accordance with the present invention. The semiconductor device of this embodiment is formed as the MOSFET like as the previous embodiment shown in FIG. 41 and has a similar structure to that of embodiment of FIG. 41. That is to say, an $n^-$ epitaxial layer 62 is formed on an $n^+$ silicon substrate 61 and recessed portions 66, 69, and 72 having overhang portions are formed in the epitaxial layer, the inner surfaces of the recessed portions are covered with insulating layers 71 and 73 made of silicon oxide, and gate electrodes 74 are formed in the recessed portions. $N^+$ source regions 63 are formed in mesa regions formed between adjacent recessed portions, and a source electrode 76 formed by a metal plate is provided to be electrically connected to the source regions. P-type gate regions 70 are formed around the recessed portions 69. These gate regions 70 are separated by the insulating layers 71 and 73. A drain electrode 75 is formed on the other surface of the silicon substrate 61 which constitutes the drain region.

In this embodiment, $p^+$ regions 77 are formed in the mesa regions formed in the surface of the epitaxial layer 62 provided on the one surface of the silicon substrate 61 such that the regions 77 are connected to the source electrode 76. The $p^+$ regions 77 are distributed appropriately over the surface of the epitaxial layer 62. By providing the $p^+$ regions 77 to be electrically connected to the source electrode 76, a high speed turn-off can be realized, because holes within the gate regions 70 at turn-off are flown into the source electrode 76 through p⁺ region 77 and are not remained in the gate regions.

Now successive steps for manufacturing the semiconductor device shown in FIG. 42 will be described. These steps are similar to those of FIGS. 25–40, and thus reference numerals used in these drawings are also used in the present embodiment as far as possible.

At first, as shown in FIG. 43, an n⁻ epitaxial layer 62 is formed on an n⁺ silicon substrate 61 constituting the drain region, and silicon oxide layers 78 and 79 are formed on the epitaxial layer and the rear surface of silicon substrate, respectively. Secondly as shown in FIG. 44, a photoresist 80 is formed on the silicon oxide layer 79 and an opening 81 is formed in the photoresist at a portion at which a p⁺ region 77 to be formed later. Then, an opening 82 is formed in the silicon oxide layer 78 by the reactive ion etching through the opening 81, and the photoresist 80 is removed as illustrated in FIG. 45. Next, a p⁺ region 83 is formed by injecting p-type impurities into the surface of the n⁻ epitaxial layer 62 through the above mentioned opening 82, and the opening 82 is closed with a silicon oxide layer by the oxidation treatment as shown in FIG. 46.

Subsequently as shown in FIG. 47, a photoresist 84 is partially formed to cover the p⁺-type region 83. As shown in FIG. 48, the silicon oxide layer 78 is selectively removed by the reactive ion etching using the photoresist as a mask. Then, an n⁺ layer 85 is formed by diffusion after the photoresist 84 is removed as shown in FIG. 49. Next, as depicted in FIG. 50, after removing the silicon oxide layer 78 by the etching using HF, the annealing treatment is carried out to drive n-type impurities from the n⁺ region layer 85 to form an n⁺ region 86, and a thick silicon oxide layer 64 is formed on the surface of the epitaxial layer 62 by the TEOS-CVD as shown in FIG. 51. Then, a photoresist 65 is formed on the silicon oxide layer 64 in accordance with a given pattern as illustrated in FIG. 52, and after that, openings 64a are formed by selectively etching the silicon oxide 64 by the RIE method using CHF₃ through openings formed in the photoresist 65 as shown in FIG. 53.

Subsequently, recessed portions 66 having a depth of 15 μms are formed in the surface of the epitaxial layer 62 by performing the anisotropic etching through the openings 64a formed in the silicon oxide layer 64 as depicted in FIG. 54. In this manner, p⁺ regions 77 and n⁺ regions 63 are formed in mesa regions formed between adjacent recessed portions. Succeeding steps are identical with those shown in FIGS. 29–41 in the previous embodiment and are dispensed with. However, in the present embodiment, the regions formed in the mesa type regions are not the n⁺ type regions 63, but a mixture of the n⁺ regions 63 and the p⁺regions 77. In this manner, the MOSFET shown in FIG. 42 can is manufactured.

Figure 55:
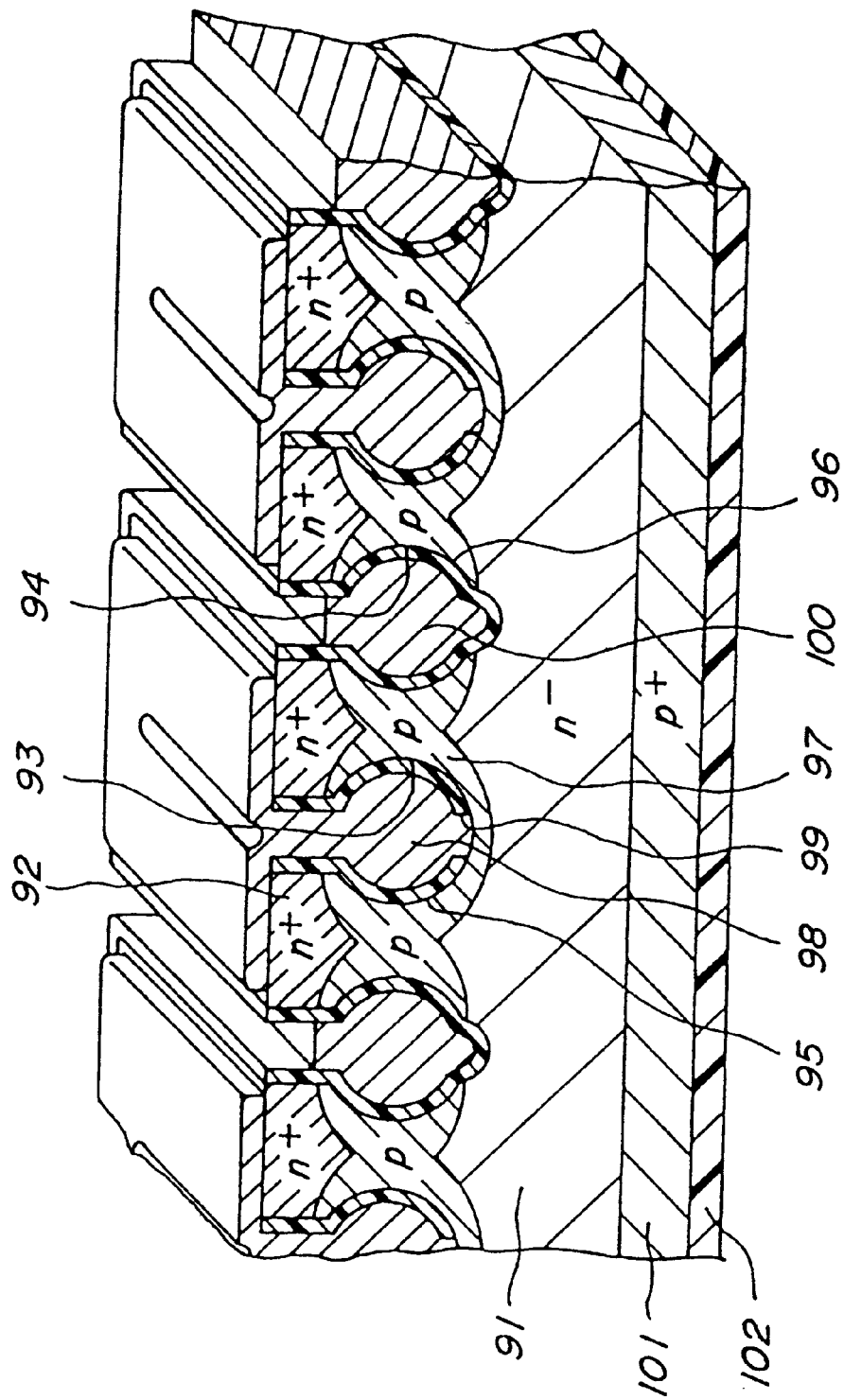
FIG. 55 is a cross sectional view showing an embodiment of IGBT according to this invention.

FIG. 55 depicts still another embodiment of the semiconductor device according to the present invention. This semiconductor device is constructed as IGBT.

In one surface of an n⁻silicon substrate 91 there are formed recessed portions such that a mesa region having a high aspect ratio and an overhang portion is formed between adjacent recessed portions, and n⁺ emitter regions 92 are formed in the mesa-type regions. The recessed portions are classified into a first group in which recessed portions are formed by the two-step etching and a second group in which recessed portions are formed by the three-step etching. On inner surfaces of the first group recessed portions, first insulating layers 95 are formed in the inner face of the first recessed portion 93, and on inner surfaces of the second group recessed portions 94, second insulating layers 96 are formed. P-type gate regions 97 are formed by diffusing p-type impurities from the recessed portions 93 and 94. The gate regions 97 are separated from each other by the second insulating layers 96.

Within the first group recessed portions 93 there are formed conducting regions 98. The conducting regions 98 are extended to the surface of the silicon substrate 91 and are brought into contact with the surface of the n⁺ emitter regions 92. The conducting regions 98 are also brought into contact with the P-type gate regions 97 through openings 99 formed in the first insulating layers 95. Gate electrodes 100 are formed within the second group recessed portions 94 by filling them with a metal or semiconductor material. A p⁺ collector region 101 is formed in the other surface of the silicon substrate 91 and a collector electrode 102 is formed on the collector region 102.

In this semiconductor device, a high speed turn-off operation can be obtained because carriers existent within the gate regions 97 at turn-off, i.e. electrons can be flown into the emitter electrode through the conducting regions 98. Moreover, since the recessed portions are formed by the two-step and three-step etching, it is possible to form the mesa-type regions having a high aspect ratio. A ratio of a cross sectional area of the emitter region to a surface area of the silicon substrate is large because the emitter region 92 is formed in the overhang portion of the mesa-type region, and a large current can be flown.

Figure 56:
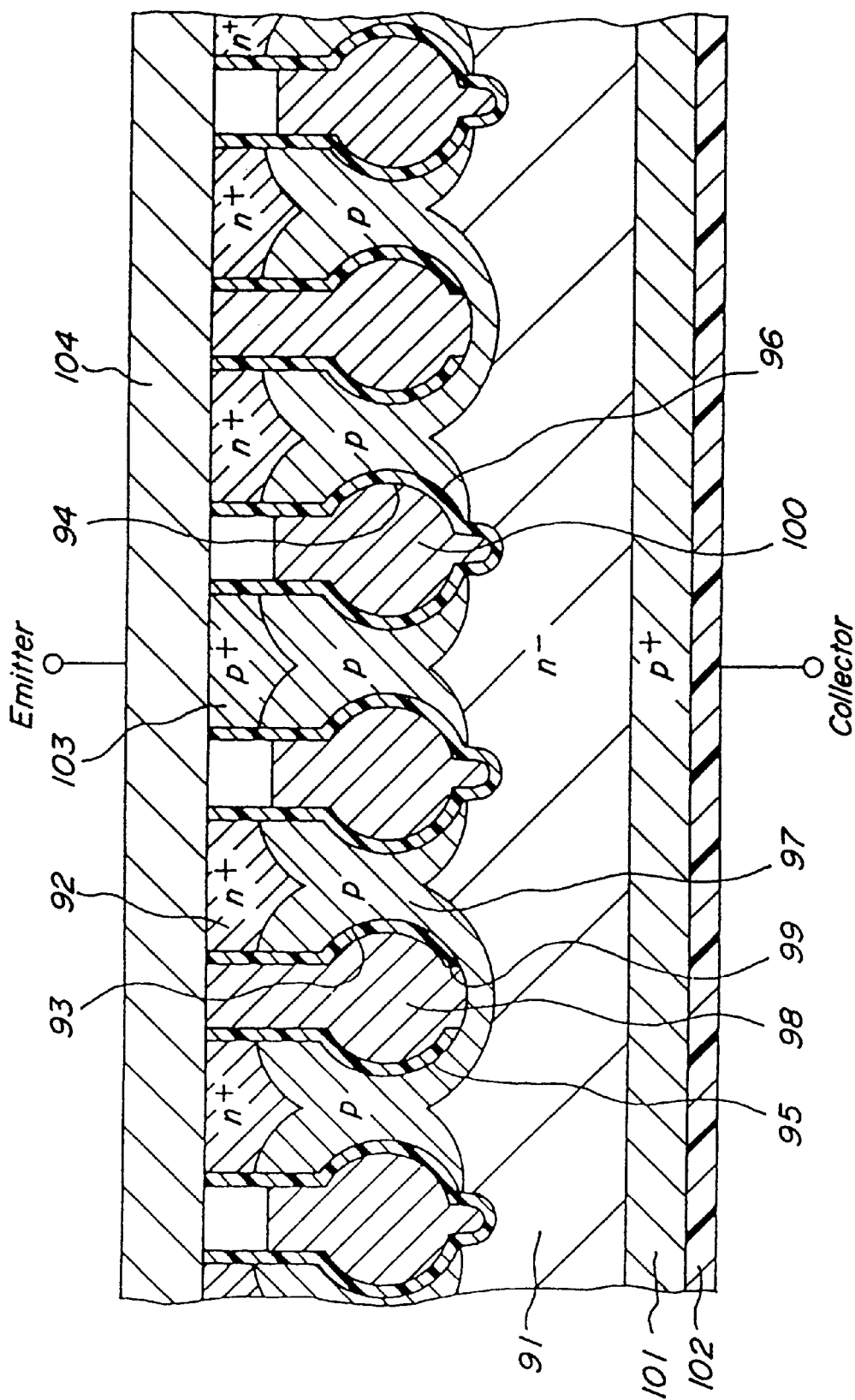
FIG. 56 is a cross sectional view showing another embodiment of IGBT according to the present invention.

FIG. 56 shows further embodiment of the semiconductor device according to the invention. The semiconductor device of this embodiment is also constructed as the IGBT like as the previous embodiment. Portions similar to those of the previous embodiment are denoted by the same reference numerals used in the previous embodiment.

In the previous embodiment, the n⁺ emitter region 92 is formed in all the mesa-type regions having the overhang portions, but in the present embodiment, a part of the emitter regions is replaced by p⁺ type short-circuit regions 103. The p⁺ short-circuit regions 103 and n⁺ emitter regions 92 are connected to the emitter electrode 104.

In this semiconductor device, a higher speed turn-off operation can be obtained because carriers existent within the gate regions 97 at turn-off, i.e. electrons are flown to the emitter electrode 104 through the conducting regions 98, and at the same time holes within the gate regions 97 are flown to the emitter electrode 104 through the emitter short-circuit regions 103. Moreover a mesa-type region having a high aspect ratio can be formed, the semiconductor device can be miniaturized, and a large current can be flown like as the previous embodiment.

The invention is not restricted to the above explained embodiments but may be changed and modified in various ways. For example, in the above embodiments, the recessed portion having a high aspect ratio is formed in the silicon substrate, but according to the invention, a recessed portion can be formed in an insulating layer such as $SiO_2$, $Si_3N_4$, SiNO and BPSG. In above embodiments, one and the same mask is used for the isotropic-etching and anisotropic etching, but according to the invention it is also possible form a new mask every time an etching treatment has been performed or after an appropriate number of etching treatments have been effected. In the case of using one and the same mask throughout the whole etching treatments, the self-alignment can be realized, and therefore error in dimension can be eliminated and the semiconductor device can be miniaturized. In the above embodiments, the isotropic etching is done as the last etching step, but according to the invention the anisotropic etching may be effected as the last etching step. In the case of forming the gate region like as the above embodiments, it is preferable to use the isotropic etching as the last etching, because it is possible to form the wider diffusion layer within the silicon substrate, to form the narrow channel region between the gate regions and to form the wide cathode region.

Moreover, in the above embodiments, SI thyristor, GTO thyristor and MOSFET are formed as the semiconductor device are described, but the present invention can be equally applied to other vertical type semiconductor devices such as SI transistor and IGBT.

POSSIBILITY OF INDUSTRIAL UTILIZATION

In the above explained semiconductor device according to the present invention, a cross sectional configuration of the recessed portion is composed of plural curved surfaces having different curvatures, and thus the recessed portion having a high aspect ratio can be obtained. In the method of manufacturing the semiconductor device according to the invention, by repeating the isotropic etching having a higher etching rate and the anisotropic etching having no lateral etching at least one time, it is possible to form a deep recessed portion having a depth not less than 10 $\mu$ms within a shorter time period. In the case of using the initially formed mask for the successive etching processes, the self-alignment process can be realized and an error in dimension during the miniaturizing process can be suppressed.

Moreover in the method according to the invention, the overhang portion at the recessed portion made of the oxide layer always acts as a mask during successive etching processes, and therefore the deep mesa-type structure can be obtained within a short period by repeating the isotropic etching step and anisotropic etching step while the same mask is used. Thus, when the present invention is applied to the power semiconductor device having the mesa-type structure, it is possible to form the wide gate region while an area of the cathode-emitter portion is maintained, and adjacent gate regions can be connected to each other by performing the impurity diffusion for a short period, and a ratio of an area of the cathode region to a whole surface can be large.

In the embodiments shown in FIGS. 42, 55, and 56, the source or drain region is formed in the mesa-type region having a high aspect ratio and an overhang portion, and thus a miniaturization can be effected and a large current can be flown. In the embodiment illustrated in FIG. 42, carries existent within the gate region at turn-off can be swept immediately and a high speed operation can be obtained by forming the source short-circuit region or an emitter short-circuit region. In the embodiment depicted in FIG. 55, a high speed operation can be also realized, because carriers at turn-off are swept through the conducting region which electrically connects the gate region to the emitter region. Furthermore, in the embodiment shown in FIG. 56, carriers at turn-off are effectively swept out so that a higher speed operation can be attained because both the emitter short-circuit region and the conducting region are formed.

What is claimed is:

1. A semiconductor device, comprising:
   a recessed portion formed in one surface of a semiconductor substrate;
   a gate structure for controlling a current flowing between surfaces of the semiconductor substrate formed in the recessed portion; and
   the recessed portion comprising a plurality of individually curved recessed portions of different curvatures;
   wherein a first of said individually curved recessed portions disposed adjacent said one surface of the substrate is formed by isotropic etching using an insulating layer having an opening as a mask, and a second of said individually curved recessed portions disposed away from said one surface of the substrate is formed in a self-alignment manner by anisotropic etching using said insulating layer as a mask.

2. A method of manufacturing a semiconductor device, comprising:
   forming a recessed portion by consecutively repeating at least one isotropic etching step followed by at least one anisotropic etching step in a self-aligned manner.

3. The method of manufacturing a semiconductor device according to claim 2, wherein the last etching step comprises isotropic etching.

4. A semiconductor device, comprising:
   a semiconductor substrate including an overhang portion over a recessed portion in one surface thereof,
   wherein the overhang portion is formed by an insulating film selected from the group consisting of an oxide layer, a nitride layer, an oxynitride layer, and a combination thereof; and
   the recessed portion comprising a plurality of individually curved recessed portions of different curvatures;
   wherein a first of said individually curved recessed portions disposed adjacent said one surface of the substrate is formed by isotropic etching using an insulating layer having an opening as a mask, and a second of said individually curved recessed portions disposed away from said one surface of the substrate is formed by in a self-aligned manner by anisotropic etching using said insulating layers as a mask.

5. The semiconductor device according to claim 4, wherein an oxide layer is formed in the last recessed portion; and
   an opening is formed at a bottom portion of the oxide layer formed in the last recessed portion.

6. The semiconductor device according to claim 5, wherein an impurity diffused region is formed under the opening formed in the bottom of the oxide layer.

7. The semiconductor device according to claim 5, wherein an etching region is formed under the opening formed in the bottom of the oxide layer.

8. The semiconductor device according to claim 7, wherein an impurity diffused region is formed in a surface of the etching region.

9. The semiconductor device according to claim 4, wherein an upper oxide layer portion including the recessed portion with the overhang portion is thicker than the bottom oxide layer.

10. A semiconductor device, comprising:
    a semiconductor substrate of one conductivity type having an epitaxial layer of the one conductivity type formed on a surface of the semiconductor substrate,
    recessed portions formed in a surface of the epitaxial layer, each recessed portion having an overhang portion disposed thereabove,
    a plurality of mesa-type regions having a high aspect ratio formed between adjacent recessed portions, the mesa-type regions comprising side edge portions forming the overhang portions,
    a source region of the one conductivity type formed in at least one of the mesa-type regions, a source short-circuit region of the other conductivity type formed in at least one of the mesa-type regions, gate regions of the other conductivity type formed along the recessed portions, insulating films formed on inner surfaces of said recessed portions to separate the gate regions, a source electrode formed on one surface of the semiconductor substrate to be electrically connected with the source region and source-circuit region, a drain region of the one conductivity type formed on the other surface of the semiconductor substrate, and a drain electrode formed on the surface of the drain region.

11. A semiconductor device, comprising:

a semiconductor substrate of one conductivity type, first and second groups of recessed portions formed on one surface of the semiconductor substrate and each having an overhang portion disposed thereabove, a plurality of mesa-type regions of high aspect ratio formed between adjacent first and second groups of recessed portions, the mesa-type regions comprising side edge portions forming the overhand portions, emitter regions of the one conductivity type formed on the surfaces of the mesa-type regions, gate regions of the other conductivity type formed along the first and second groups of recessed portions, first insulated layers formed on the inner surface of the first group of recessed portions to separate the gate regions, second insulated layers formed on the inner surface of the second group of recessed portions, gate electrodes formed in the first group of recessed portions, conducting regions formed in the second group of recessed portions to be electrically connected with the gate regions through openings formed in the second insulating layer, an emitter electrode electrically connected with the emitter regions and with the conducting regions formed in the second group of recessed portions, a collector region of the other conductivity type formed on the other surface of the semiconductor substrate, and a collector electrode formed on the surface of the collector region.

12. The semiconductor device according to claim 11, wherein an emitter short-circuit region of the other conductivity type is formed on the surface of the mesa-type region formed between adjacent first group of recessed portions and the emitter short-circuit region is connected to the emitter electrode.

* * * * *